(12) United States Patent
Chung et al.

(10) Patent No.: US 11,362,249 B2
(45) Date of Patent: Jun. 14, 2022

(54) DISPLAY MODULE AND MANUFACTURING METHOD THEREOF

(71) Applicant: SAMSUNG ELECTRONICS CO., LTD., Suwon-si (KR)

(72) Inventors: Changkyu Chung, Suwon-si (KR); Changjoon Lee, Suwon-si (KR); Kwangrae Jo, Suwon-si (KR); Sungyong Min, Suwon-si (KR); Wonsoon Park, Suwon-si (KR); Kyungwoon Jang, Suwon-si (KR); Daesuck Hwang, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 49 days.

(21) Appl. No.: 16/991,133

(22) Filed: Aug. 12, 2020

(65) Prior Publication Data

US 2021/0111324 A1    Apr. 15, 2021

(30) Foreign Application Priority Data

Oct. 11, 2019  (KR) .................. 10-2019-0126164

(51) Int. Cl.
*H01L 33/62*  (2010.01)
*H01L 27/15*  (2006.01)
(Continued)

(52) U.S. Cl.
CPC .............. *H01L 33/62* (2013.01); *G09G 3/32* (2013.01); *H01L 27/156* (2013.01);
(Continued)

(58) Field of Classification Search
None
See application file for complete search history.

(56) References Cited

U.S. PATENT DOCUMENTS 9,799,634 B2  10/2017  Rhee
9,846,510 B2  12/2017  Rhee
(Continued)

FOREIGN PATENT DOCUMENTS

CN  108206234 A  *  6/2018  ......... H01L 25/0753
EP  3544386 A1      9/2019
(Continued)

OTHER PUBLICATIONS

International Search Report (PCT/ISA/210) and Written Opinion (PCT/ISA/237) dated Nov. 18, 2020 issued by the International Searching Authority in International Application No. PCT/KR2020/010671.
(Continued)

*Primary Examiner* — Robert K Carpenter
(74) *Attorney, Agent, or Firm* — Sughrue Mion, PLLC

(57) ABSTRACT

A method of manufacturing a display module includes forming a driving circuit layer on a substrate, the driving circuit layer including a plurality of driving circuits and a plurality of electrode pads electronically connected with the plurality of driving circuits; forming an adhesive layer on the driving circuit layer; transferring each of a plurality of light emitting diodes (LEDs) onto a respective area of the adhesive layer corresponding to a respective one of the plurality of electrode pads; and forming a black matrix layer on the adhesive layer, between the plurality of LEDs.

9 Claims, 33 Drawing Sheets

(51) Int. Cl.
*H01L 33/58* (2010.01)
*H01L 33/48* (2010.01)
*H01L 33/00* (2010.01)
*G09G 3/32* (2016.01)

(52) U.S. Cl.
CPC ........ *H01L 33/0093* (2020.05); *H01L 33/486* (2013.01); *H01L 33/58* (2013.01); *H01L 2933/0066* (2013.01)

(56) References Cited

U.S. PATENT DOCUMENTS

| | | |
|---|---|---|
| 10,720,086 B2 | 7/2020 | Choi et al. |
| 10,964,674 B2 | 3/2021 | Bang et al. |
| 2010/0133419 A1 | 6/2010 | Suetake |
| 2011/0146889 A1 | 6/2011 | Hwang |
| 2015/0228865 A1 | 8/2015 | Rhee |
| 2015/0362165 A1 | 12/2015 | Chu et al. |
| 2019/0088168 A1 | 3/2019 | Choi et al. |
| 2019/0244938 A1 | 8/2019 | Bang et al. |
| 2020/0058838 A1 | 2/2020 | Choi et al. |
| 2020/0350464 A1 | 11/2020 | Shin et al. |
| 2021/0005796 A1 | 1/2021 | Min et al. |

FOREIGN PATENT DOCUMENTS

| | | |
|---|---|---|
| JP | 4832500 B2 | 12/2011 |
| JP | 2016-197668 A | 11/2016 |
| JP | 2017-520915 A | 7/2017 |
| KR | 1020100116101 A | 10/2010 |
| KR | 10-1111112 B1 | 2/2012 |
| KR | 1020130137985 A | 12/2013 |
| KR | 10-2014-0119515 A | 10/2014 |
| KR | 1020180102422 A | 9/2018 |
| KR | 10-2019-0031047 A | 3/2019 |
| KR | 10-2019-0053500 A | 5/2019 |
| KR | 10-2019-0109222 A | 9/2019 |
| KR | 1020210004128 A | 1/2021 |
| WO | 2015/191273 A1 | 12/2015 |
| WO | 2018092977 A1 | 5/2018 |

OTHER PUBLICATIONS

Communication dated Feb. 3, 2022 by the European Patent Office for European Patent Application No. 20873432.7.

* cited by examiner

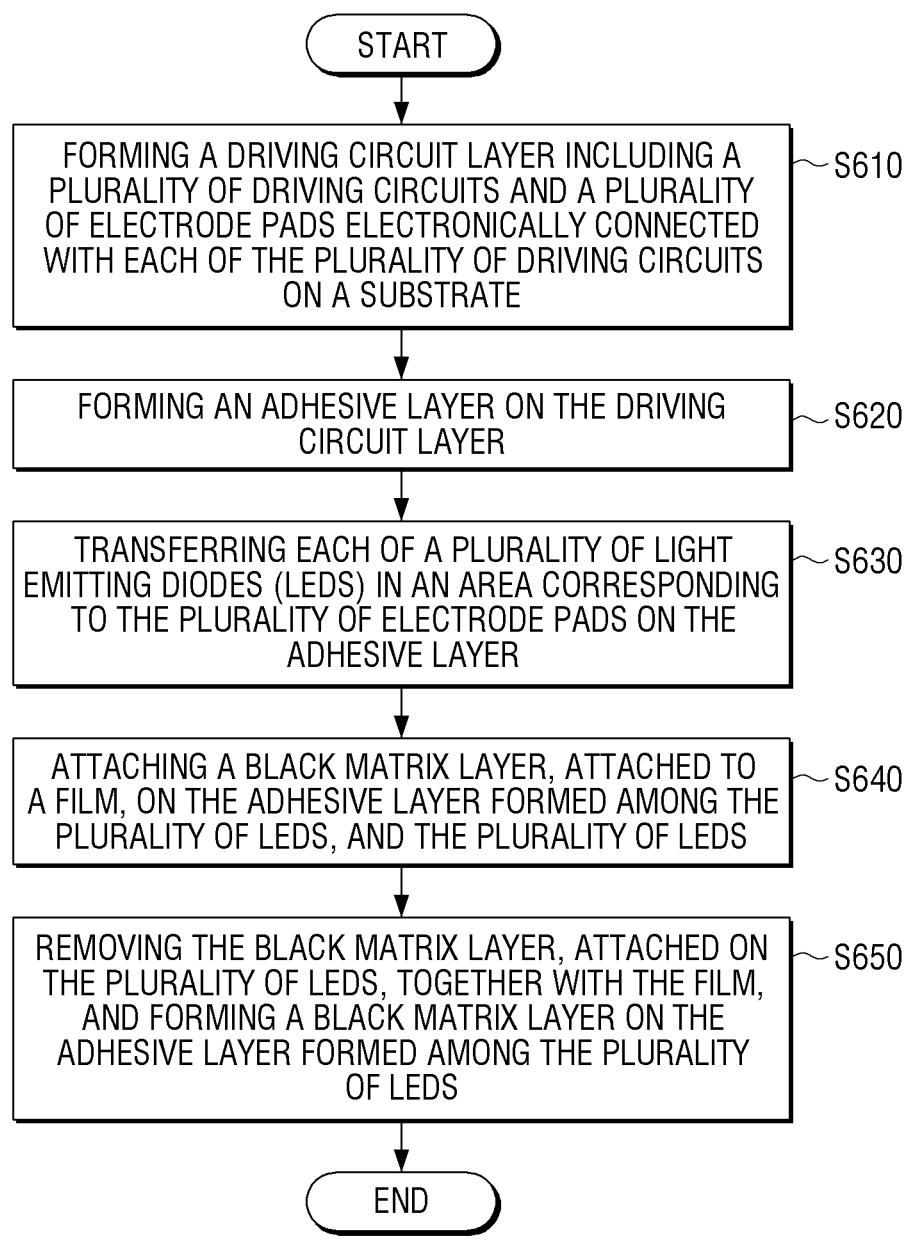

DISPLAY MODULE AND MANUFACTURING METHOD THEREOF

CROSS-REFERENCE TO THE RELATED APPLICATION

This application is based on and claims priority under 35 U.S.C. § 119(a) to Korean Patent Application Number 10-2019-0126164, filed on Oct. 11, 2019, in the Korean Intellectual Property Office, the disclosure of which is hereby incorporated by reference in its entirety.

BACKGROUND

1. Field

Embodiments of the present disclosure relate to a display module and a manufacturing method thereof, and more particularly, to a display module for micro LEDs and a manufacturing method thereof.

2. Description of Related Art

Light emitting diodes (LEDs) are semiconductor elements which emit light when a voltage is applied, and are being used widely not only as general lighting devices but also as a light source of display devices for displaying images.

Recently, display devices (or display panels, display modules, etc.) which use micro LEDs (μ-LEDs or micro light emitting diodes) as a light source in pixel or sub pixel units are being developed. Here, micro LEDs may refer to semiconductor light emitting elements of which width, length, and height are respectively in sizes of between 1 and 100 micrometers (μm).

Here, micro LED display panels provide better contrast, response time, and energy efficiency than liquid crystal display (LCD) panels which need a separate backlight unit. Also, as micro LED display panels use inorganic substances, there are advantages such as fewer burn-in phenomena of a screen, a longer lifespan, higher light emitting efficiency, and higher brightness than organic LEDs (OLEDs).

In general, in a method of manufacturing a display module using micro LEDs as a light source, micro LEDs are transferred to a substrate through a transfer process, and the electrode pad of the micro LEDs and the electrode pad of the substrate are electronically connected through a connection process such as soldering and thermosetting. Afterwards, a black matrix (BM) layer is formed in a non-emitting area through printing (e.g.: inkjet/screen printing, etc.) or exposure/development. Here, a BM is a substance that absorbs light and has a black color, and it may be used to enhance a contrast ratio of a display by reducing reflective light by external light.

However, in the case of such a general BM-forming method, a BM opening area wherein BMs are not formed around micro LEDs may be formed, due to various factors such as the size tolerance of a substrate itself, the tolerance of the size or connecting location of micro LEDs, the distance between micro LEDs, the tolerance of alignment between a substrate and BMs in the case of printing or exposure/development, the size tolerance of a BM itself in the case of combining a patterned BM component and a substrate, a tolerance generated in a BM-forming process such as an alignment tolerance, etc. A BM opening area has a problem that it reduces a contrast ratio as it exposes a part of a substrate (e.g., an electrode pad of a substrate), and reduces the overall expressiveness of a black color. Also, there is a problem that, in case alignment does not fit well, BMs may be formed on micro LEDs, and such BMs formed on micro LEDs cover the light emitting surface of the micro LEDs, which leads to reduction of light emitting efficiency.

SUMMARY

According to one or more embodiments, a method of manufacturing a display module including a plurality of pixels is provided. The method includes: forming a driving circuit layer on a substrate, the driving circuit layer including a plurality of driving circuits and a plurality of electrode pads electronically connected with the plurality of driving circuits; forming an adhesive layer on the driving circuit layer; transferring each of a plurality of light emitting diodes (LEDs) onto a respective area of the adhesive layer corresponding to a respective one of the plurality of electrode pads; and forming a black matrix layer on the adhesive layer, between the plurality of LEDs. The attaching includes attaching a black matrix formation layer, attached to a film, onto the plurality of LEDs and onto a portion of the adhesive layer formed between the plurality of LEDs, and removing a first portion of the black matrix formation layer, attached on the plurality of LEDs, together with the film such that a second portion of the black matrix formation layer remains between the plurality of LEDs as the black matrix layer. Each of the plurality of pixels includes a plurality of sub pixels, and each of the plurality of electrode pads includes a first area for bonding a first LED corresponding to a sub pixel among the plurality of sub pixels and a second area for bonding a second LED corresponding to the sub pixel based on the first LED being defective.

According to an embodiment, the attaching includes attaching the black matrix formation layer onto the portion of the adhesive layer, formed between the plurality of LEDs, and onto the plurality of LEDs through a thermo-compression process.

According to an embodiment, the adhesive layer includes an anisotropic conductive film (ACF) including a conductive material, and the attaching further includes electronically connecting each of the plurality of LEDs to the plurality of electrode pads through the conductive material.

According to an embodiment, the adhesive layer includes a non-conductive film including a flux, the attaching further includes: melting bumps, the bumps applied on an electrode of each of the plurality of LEDs or on the plurality of electrode pads, and electronically connecting each of the plurality of LEDs to the plurality of electrode pads through the bumps, while the bumps are in a molten form, and the flux is configured to remove an oxide film generated when the bumps are melted.

According to an embodiment, an adhesive force between the adhesive layer and the black matrix formation layer is stronger than an adhesive force between the film and the black matrix formation layer.

According to an embodiment, the removing includes: attaching, after removing the film from the black matrix formation layer, a tape onto the black matrix formation layer, and removing a remaining portion of the black matrix formation layer, attached on the plurality of LEDs, together with the tape from the plurality of LEDs such that the second portion of the black matrix formation layer remains between the plurality of LEDs as the black matrix layer, wherein an adhesive force between the tape and the black matrix formation layer is weaker than an adhesive force between the black matrix formation layer and the adhesive layer.

According to an embodiment, the second LED is configured to emit a light of the same color as the first LED.

According to an embodiment, a size of each of the plurality of electrode pads is bigger than the size of the first LED, and the first area and the second area are electronically connected.

According to an embodiment, each of the plurality of LEDs is a micro LED of a flip-chip structure wherein an electrode is formed in a lower part of the flip-chip structure.

According to one or more embodiments, a display module is provided. The display module includes: a substrate; a driving circuit layer formed on the substrate, the driving circuit layer including a plurality of driving circuits and a plurality of electrode pads electronically connected with the plurality of driving circuits; an adhesive layer formed on the driving circuit layer; a plurality of light emitting diodes (LEDs), each of the plurality of LEDs formed on a respective area of the adhesive layer corresponding to a respective one of the plurality of electrode pads; and a black matrix layer formed on the adhesive layer, between the plurality of LEDs, wherein the display module is configured to include a plurality of pixels that include a plurality of sub pixels, and each of the plurality of electrode pads includes a first area for bonding a first LED corresponding to a sub pixel among the plurality of sub pixels and a second area for bonding a second LED corresponding to the sub pixel based on the first LED being defective.

According to an embodiment, the black matrix layer is formed on the adhesive layer, between the plurality of LEDs, by: attaching a black matrix formation layer, attached to a film, onto a portion of the adhesive layer, formed between the plurality of LEDs, and onto the plurality of LEDs through a thermo-compression process, and removing a first portion of black matrix formation layer, attached on the plurality of LEDs, together with the film from the plurality of LEDs such that a second portion of the black matrix formation layer remains between the plurality of LEDs as the black matrix layer.

According to an embodiment, the plurality of LEDs are electronically connected to the plurality of electrode pads through the thermo-compression process.

According to an embodiment, the adhesive layer includes an anisotropic conductive film (ACF) including a conductive material, and the plurality of LEDs are electronically connected to the plurality of electrode pads through the conductive material by the thermo-compression process.

According to an embodiment, the adhesive layer includes a non-conductive film including a flux, bumps are applied on an electrode of each of the plurality of LEDs or applied on the plurality of electrode pads, the bumps melted through the thermo-compression process, the plurality of LEDs are electronically connected to the plurality of electrode pads through the bumps, while the bumps are in a molten form, and the flux is configured to remove an oxide film generated when the bumps are melted.

According to an embodiment, an adhesive force between the adhesive layer and the black matrix formation layer is stronger than an adhesive force between the film and the black matrix formation layer.

According to an embodiment, the second LED is configured to emit a light of a same color as the first LED.

According to an embodiment, a size of each of the plurality of electrode pads is bigger than the size of the first LED, and the first area and the second area are electronically connected.

According to an embodiment, each of the plurality of LEDs is a micro LED of a flip-chip structure wherein an electrode is formed in a lower part of the flip-chip structure.

According to one or more embodiments, a method of manufacturing a display module is provided. The method includes: forming a driving circuit layer on a substrate, the driving circuit layer including a plurality of driving circuits and a plurality of electrode pads electronically connected with the plurality of driving circuits; forming an adhesive layer on the driving circuit layer; transferring each of a plurality of light emitting diodes (LEDs) onto a respective area of the adhesive layer corresponding to a respective one of the plurality of electrode pads, the plurality of LEDs configured to form a pixel; and forming a black matrix layer on the adhesive layer, between the plurality of LEDs, by: attaching a black matrix formation layer, attached to a film, onto the plurality of LEDs and onto a portion of the adhesive layer formed between the plurality of LEDs, and removing a first portion of the black matrix formation layer, attached on the plurality of LEDs, together with the film such that a second portion of the black matrix formation layer remains between the plurality of LEDs as the black matrix layer.

According to an embodiment, the attaching includes attaching the black matrix formation layer onto the portion of the adhesive layer, formed between the plurality of LEDs, and onto the plurality of LEDs through a thermo-compression process.

BRIEF DESCRIPTION OF THE DRAWINGS

FIG. 6 is a flow chart for illustrating a method of manufacturing a display panel according to an embodiment of the disclosure;

DETAILED DESCRIPTION

Figure 1:
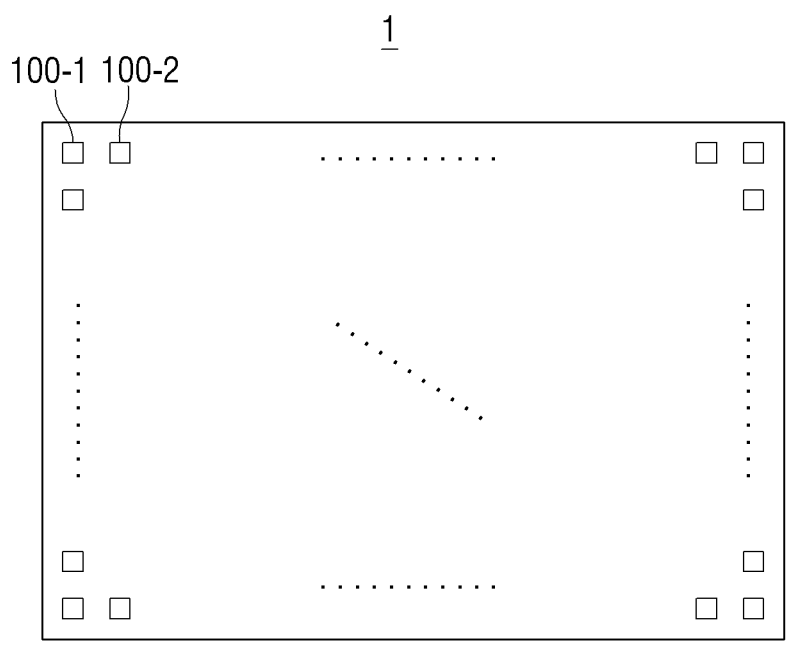
FIG. 1 is a diagram for illustrating a display module according to an embodiment of the disclosure.

According to an aspect of an embodiment of the present disclosure, a display module is provided that enhances the expressiveness of a black color, and a manufacturing method of the display module is provided.

In describing aspects of the disclosure, in case it is determined that detailed explanation of related known functions or components may unnecessarily confuse the gist of the disclosure, detailed explanation will be omitted. In addition, the embodiments below may be modified in various different forms, and the scope of the technical idea of the disclosure is not limited to the embodiments below. Rather, these embodiments are provided to make the disclosure more sufficient and complete, and to fully convey the technical idea of the disclosure to those skilled in the art.

Also, the embodiments of the disclosure are not for limiting the technology described in the disclosure to a specific embodiment, but they should be interpreted to include various modifications, equivalents and/or alternatives of the embodiments of the disclosure. Also, with respect to the detailed description of the drawings, similar components may be designated by similar reference numerals.

In addition, the expressions "first," "second" and the like used in the disclosure may be used to describe various elements regardless of any order and/or degree of importance. Also, such expressions are used only to distinguish one element from another element, and are not intended to limit the elements.

Further, in the disclosure, the expressions "A or B," "at least one of A and/or B," or "one or more of A and/or B" and the like may include all possible combinations of the listed items. For example, "A or B," "at least one of A and B," or "at least one of A or B" may refer to all of the following cases: (1) including at least one A, (2) including at least one B, or (3) including at least one A and at least one B.

Also, in the disclosure, singular expressions include plural expressions as long as they do not clearly mean differently in the context. In addition, in the disclosure, terms such as "include" and "comprises" should be construed as designating that there are such characteristics, numbers, steps, operations, elements, components or a combination thereof described in the specification, but not as excluding in advance the existence or possibility of adding one or more of other characteristics, numbers, steps, operations, elements, components or a combination thereof.

Further, the description in the disclosure that one element (e.g.: a first element) is "(operatively or communicatively) coupled with/to" or "connected to" another element (e.g.: a second element) should be interpreted to include both the case where the one element is directly coupled to the another element, and the case where the one element is coupled to the another element through still another element (e.g.: a third element). In contrast, the description that one element (e.g.: a first element) is "directly coupled" or "directly connected" to another element (e.g.: a second element) can be interpreted to mean that still another element (e.g.: a third element) does not exist between the one element and the another element.

Also, the expression "configured to" used in the disclosure may be interchangeably used with other expressions such as "suitable for," "having the capacity to," "designed to," "adapted to," "made to" and "capable of," depending on cases. Meanwhile, the term "configured to" does not necessarily mean that a device is "specifically designed to" in terms of hardware. Instead, under some circumstances, the expression "a device configured to" may mean that the device "is capable of" performing an operation together with another device or component. For example, the phrase "a processor configured to perform A, B, and C" may mean a dedicated processor (e.g.: an embedded processor) for performing the corresponding operations, or a generic-purpose processor (e.g.: a CPU or an application processor) that can perform the corresponding operations by executing one or more software programs stored in a memory device.

Hereinafter, various non-limiting example embodiments of the disclosure will be described in detail with reference to the accompanying drawings.

FIG. 1 is a diagram for illustrating a display module according to an embodiment of the disclosure.

Referring to FIG. 1, the display module 1 may include a plurality of pixels (e.g., first pixel 100-1 and second pixel 100-2).

The display module 1 may display an image through the plurality of pixels (e.g., first pixel 100-1 and second pixel 100-2). Here, the first pixel 100-1 is a minimum unit constituting an image, and may refer to a point having an independent color or brightness. Here, the first pixel 100-1 may comprise or consist of a combination of a plurality of sub pixels (e.g., sub pixels such as red, green, blue, etc.).

The plurality of pixels (e.g., first pixel 100-1 and second pixel 100-2) may be arranged while being separated from each other per a predetermined interval between each other. Also, the plurality of pixels (e.g., first pixel 100-1 and second pixel 100-2) may be arranged in the form of a matrix. Here, a matrix form may refer to a form of having rows and columns of the same number as one another (e.g., in case M=N, a 3×3 arrangement, a 5×5 arrangement, etc., and here, M and N are natural numbers) or a form of having rows and columns of different numbers from one another (e.g., in case M N, a 3×2 arrangement, a 5×4 arrangement, etc., and here, M and N are natural numbers).

Meanwhile, the plurality of pixels (e.g., first pixel 100-1 and second pixel 100-2) may have structures and functions that are same as one another. Thus, unless there is a special circumstance, explanation for the first pixel 100-1 can be applied to other pixels of the plurality of pixels (e.g., second pixel 100-2) in the same manner.

Meanwhile, as a different example from the above, the display module 1 is one of a plurality of display modules, and may be connected with another display module and display an image. For this, the plurality of display modules may be arranged in the aforementioned matrix form.

Hereinafter, the display module according to an embodiment of the disclosure will be described in more detail with reference to the accompanying drawings.

Figure 2A:
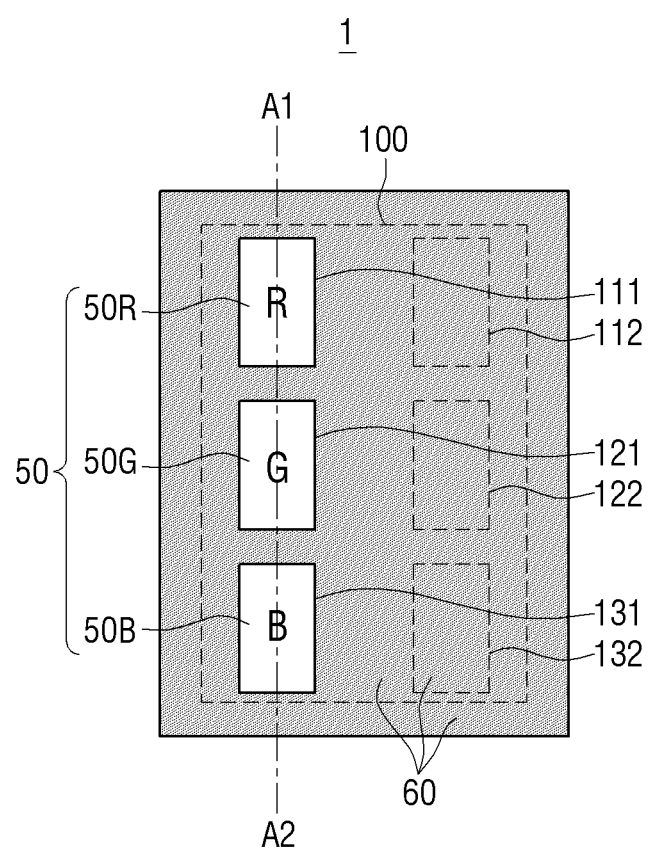
FIG. 2A is a diagram for illustrating a display module according to an embodiment of the disclosure.
Figure 2B:
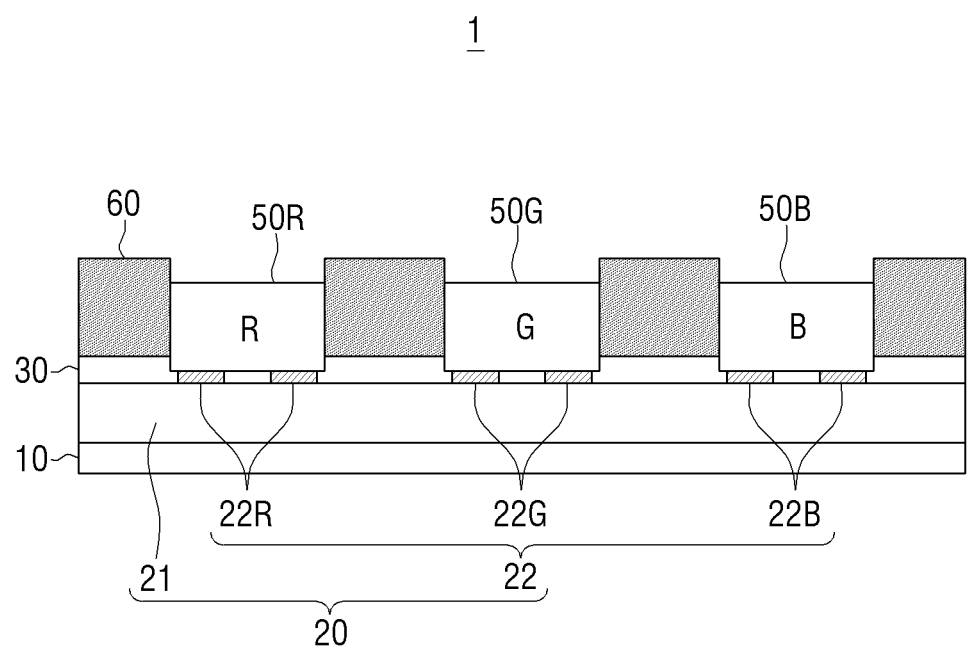
FIG. 2B is a cross-sectional diagram for illustrating the display module of FIG. 2A according to the embodiment of the disclosure.

FIG. 2A is a diagram for illustrating a display module according to an embodiment of the disclosure, and FIG. 2B is a cross-sectional diagram with respect to the A1-A2 line in FIG. 2A.

Referring to FIG. 2A and FIG. 2B, the display module 1 may include a substrate 10, a driving circuit layer 20, an adhesive layer 30, a plurality of light emitting diodes (LEDs) 50 (e.g., red LED 50R, green LED 50G, blue LED 50B), and a black matrix layer 60.

The substrate 10 may be implemented in the form of a plate of which thickness is small compared to the width and length. For example, the substrate 10 may have various thicknesses such as from scores of micrometers to scores of millimeters.

Also, the substrate 10 may perform a function of supporting and protecting various electronic elements such as the driving circuit layer 20, the plurality of LEDs 50, etc. formed on the substrate 10, and may be implemented as a material having a transparent property, or a rigid or flexible property. For example, the substrate 10 may be implemented as various materials such as glass, polyimide (PI), polyethylene terephthalate (PET), polyethylene naphthalate (PEN), polyvinyl chloride (PVC), poly methyl methacrylate (PMMA), etc.

The driving circuit layer 20 may be formed on the substrate 10. Also, the driving circuit layer 20 may include a plurality of driving circuits 21 and a plurality of electrode pads 22 (e.g., electrode pad 22R, electrode pad 22G, electrode pad 22B).

The driving circuits 21 may transmit a driving signal to the LEDs 50 that makes the LEDs 50 emit light. Specifically, the driving circuits 21 may control the ON/OFF state of a switching element (not shown), and transmit a driving signal to the LEDs 50 while the switching element is turned on, and thereby control the LEDs 50 to emit light. Here, the switching element may be implemented as, for example, a thin film transistor (TFT, not shown). Various circuits included in the driving circuits 21 may be implemented in forms such as a printed circuit board (PCB), etc.

Here, a TFT (or backplane) is not limited to a specific structure or type. That is, a TFT may be implemented as a low-temperature polycrystalline silicon (LTPS) TFT, an oxide TFT, a poly silicon TFT, an amorphous silicon (a-silicon) TFT, an organic TFT, a graphene TFT, etc. Also, a TFT may be implemented as various types such as a P-type (or N-type) MOSFET formed in a Si-wafer CMOS process, etc.

For this, the driving circuits 21 may be electronically connected with the LEDs 50 through the electrode pads 22. Here, the electrode pads 22 are electronically connected with the driving circuits 21, and may be implemented as various materials having high electrical conductivity such as Cu, Au, Ag, Indium Tin Oxide (ITO), etc. Also, the electrode pads 22 are divided into anodes and cathodes according to polarity, and anodes and cathodes may be electronically separated (or insulated) from each other.

Each of the plurality of electrode pads 22 (e.g., electrode pad 22R, electrode pad 22G, electrode pad 22B) may include one from among first areas 111, 121, 131 for bonding a first LED corresponding to one sub pixel among the plurality of sub pixels (e.g.: one of red, green, and blue sub pixels) and a second area 112, 122, 132 for bonding a second LED corresponding to the sub pixel in case the first LED is defective.

The adhesive layer 30 may be formed on the driving circuit layer 20. The adhesive layer 30 may attach the plurality of LEDs 50, transferred on the driving circuit layer 20, on the driving circuit layer 20. For this, the adhesive layer 30 may be implemented as various materials having adhesiveness.

The adhesive layer 30 according to an embodiment of the disclosure includes an anisotropic conductive film (ACF) 31 (refer to FIGS. 3A, 5A, 9B as an example), and the ACF 31 may include a conductive material 32. In this case, the plurality of LEDs 50 may be electronically connected to the plurality of electrode pads 22 through the conductive material 32 by a thermo-compression process.

The adhesive layer 30 according to an embodiment of the disclosure includes a non-conductive film 35 (refer to FIGS. 3B, 5B, 8D, 9D, 11B as an example) and the non-conductive film 35 may include a flux (not shown). In this case, bumps applied on the electrode of each of the plurality of LEDs 50 or bumps applied on the plurality of electrode pads 22 are melted by a thermo-compression process, and the plurality of LEDs 50 may be electronically connected to the plurality of electrode pads 22 through the molten pumps. Here, an oxide film that is generated when the bumps are melted may be removed by the flux.

The plurality of LEDs 50 may be electronically connected to the plurality of electrode pads 22 by a thermo-compression process.

Specifically, before the adhesive layer 30 is cured through a thermo-compression process, the adhesive layer 30 may have fluidity (or flowability). After the adhesive layer 30 is cured through a thermo-compression process, the fluidity of the adhesive layer 30 may be reduced and the adhesiveness of the adhesive layer 30 may be improved.

For example, when the adhesive layer 30 pressurizes the plurality of LEDs 50 transferred on the driving circuit layer 20 in the direction of the substrate 10 through a thermo-compression process, the plurality of LEDs 50 push the adhesive layer 30 located in the lower part to the surrounding part due to the fluidity of the adhesive layer 30, and accordingly, a form wherein some of the plurality of LEDs 50 are buried and others of the plurality of LEDs 50 are projected based on the longitudinal direction of the adhesive layer 30 may be constituted. Here, the plurality of LEDs 50 may be pressurized to be electronically connected with the plurality of driving circuits 21 through the plurality of electrode pads 22. Afterwards, when the adhesive layer 30 is cured, the plurality of LEDs 50 may be fixed on the driving circuits 21 while being electronically connected with the plurality of driving circuits 21 through the plurality of electrode pads 22. More detailed explanation in this regard will be made later with reference to FIG. 3A and FIG. 3B.

Each of the plurality of LEDs 50 may emit a light in a specific color. Here, each of the plurality of LEDs 50 may be a micro LED of which width, length, and height have a size of greater than or equal to 1 micrometer (µm) and smaller than or equal to 100 micrometers.

Specifically, each of the plurality of LEDs 50 may emit a light of a color among the three primary colors of lights (e.g., red, green, and blue), and form sub pixels. Here, the plurality of sub pixels may refer to subordinate units constituting the pixel 100.

For example, the red LED 50R may emit a light of a red color and form a red sub pixel, the green LED 50G may emit a light of a green color and form a green sub pixel, and the blue LED 50B may emit a light of a blue color and form a blue sub pixel. In this case, by a combination of lights emitted from the red LED 50R, the green LED 50G, and the blue LED 50B, one pixel 100 expressing a specific color and brightness may be constituted.

For this, the plurality of LEDs 50 may be formed on an area of the adhesive layer 30 corresponding to the plurality of electrode pads 22.

Specifically, the plurality of LEDs 50 may be formed in an area electronically connected with the plurality of electrode pads 22. For example, the plurality of LEDs 50 may be formed in an area wherein the plurality of LEDs 50 and the plurality of electrode pads 22 of the driving circuit layer 20 directly contact with one another, or indirectly contact through an electrically conductive material.

Here, the area wherein the plurality of LEDs 50 and the plurality of electrode pads 22 of the driving circuit layer 20 are electronically connected may be the first areas 111, 121, 131 or the second areas 112, 122, 132 existing on the plurality of electrode pads 22.

Figure 2C:
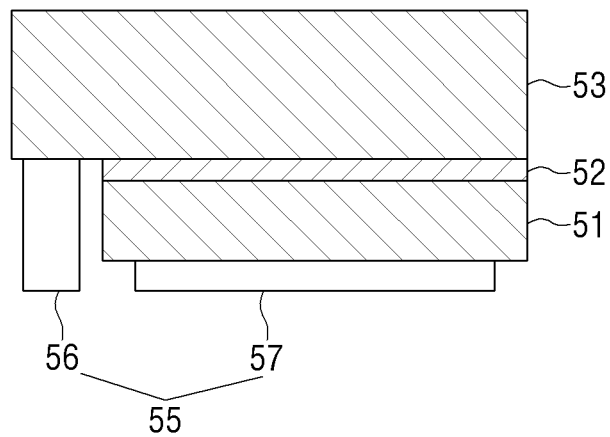
FIG. 2C is a cross-sectional diagram for illustrating an LED according to an embodiment of the disclosure.

Referring to FIG. 2C, each of the LEDs 50 may include a first semiconductor layer 51, a second semiconductor layer 53, a light emitting layer 52, and an electrode 55.

One of the first and second semiconductor layers 51, 53 may be constituted as an n-type semiconductor and the other may be constituted as a p-type semiconductor. Specifically, the first and second semiconductor layers 51, 53 may be constituted as various semiconductors of an n-type or a p-type having band gap energy (eV) corresponding to a specific wavelength inside a spectrum of lights. For example, the first and second semiconductor layers 51, 53 may include at least one layer among compounds such as GaAs, GaInN, AlInGaP, AlInGaN, GaP, GaN, SiC, sapphire (Al$_2$O$_3$), etc., and according to compounds and composition ratios, lights having wavelengths of red, green, and blue colors may be emitted from an active layer, and sub pixels of red, green, and blue colors may be implemented.

The light emitting layer (or the active layer) 52 may refer to a layer that is formed between the first and second semiconductor layers 51, 53 as the first and second semiconductor layers 51, 53 are joined. Also, the light emitting layer 52 may include at least one barrier layer having a single quantum well structure or a multi-quantum well (MQW) structure.

The electrode 55 of each of the LEDs 50 may include a first electrode 56 and a second electrode 57 electronically connected with each of the anode and the cathode of one of the electrode pads 22 of one of driving circuits 21. Here, the first electrode 56 and the second electrode 57 may be one of an n-type electrode and a p-type electrode according to the type (an n-type or a p-type) of the first and second semiconductor layers 51, 53.

Meanwhile, each of the plurality of LEDs 50 may be a micro LED of a flip-chip structure wherein the electrode 55 is formed in the lower part. Here, a flip-chip structure may refer to a structure wherein the first electrode 56 and the second electrode 57 are formed on the lower surface of one of the LEDs 50 as in FIG. 2C. That is, the electrode 55 of the micro LED of a flip-chip structure may be formed on the lower surface of the micro LED so as to oppose one of the electrode pads 22 of one of the driving circuits 21.

However, this is merely an example, and the display module may be implemented while being modified to various structures such as a vertical structure wherein one of the first electrode 56 and the second electrode 57 is formed on each of the upper surface and the lower surface of one of the LEDs 50, a structure wherein both the first electrode 56 and the second electrode 57 are formed on the upper surface of the LED 50, etc.

Referring to FIG. 2A and FIG. 2B again, the black matrix layer 60 may be formed on the adhesive layer 30 formed between the plurality of LEDs 50.

The black matrix layer 60 may be formed in the remaining area of the adhesive layer 30 excluding the area to which the plurality of LEDs 50 are bonded. That is, the black matrix layer 60 may cover the area on the adhesive layer 30 to which the plurality of LEDs 50 are not bonded. Here, the black matrix layer 60 has a property of absorbing a light and expressing a black color, and it may be implemented as various materials such as a polymer, a metal oxide, etc. Also, the black matrix layer 60 may include a material having a high resistive property.

The black matrix layer 60 may be formed on the adhesive layer 30 among the plurality of LEDs 50 as the black matrix layer 70 (e.g., a black matrix formation layer) (refer to FIG. 10A) attached to a film 80 (refer to FIG. 10A) is attached on an area (or called "a gap area") of the adhesive layer 30 formed between the plurality of LEDs 50 through a thermo-compression process, and the black matrix layer 71, 72 (e.g., the black matrix formation layer) (refer to FIG. 11A and FIG. 12B) attached on the plurality of LEDs 50 is removed together with the film 80. Here, the adhesive force between the adhesive layer 30 and the black matrix layer 60 may be stronger than the adhesive force between the film 80 and the black matrix layer 60. Detailed explanation in this regard will be made later with reference to FIG. 10A to FIG. 12C.

The display module 1 according to the various embodiments of the disclosure as above can overcome most of the problems that are generated by a general method of forming a black matrix.

Specifically, the display module 1 according to an embodiment of the disclosure does not use printing and exposure/development processes of liquids such as ink. Accordingly, management of tolerances such as the tolerance of alignment necessary for printing and exposure/development processes, the tolerance of the material of a substrate, the tolerance of the connection location of LEDs, the tolerance in a printing process, the tolerance in an exposure/development process, the tolerance of the material of a black matrix, etc., is not required, and processes can be simplified.

Also, as liquids are not used, the black matrix layer 60 is not formed on the plurality of LEDs 50, and by virtue of this, a defect that lights emitted from the plurality of LEDs 50 are covered by the black matrix layer 60 can be prevented.

In addition, as the black matrix layer 60 is formed by forming the adhesive layer 30 in the entire area of the driving circuit layer 20, attaching the plurality of LEDs 50 on the adhesive layer 30, and by using the adhesive force of the exposed part of the adhesive layer 30, generation of a BM opening area wherein a black matrix is not formed between the plurality of LEDs 50 can be minimized. That is, by forming the black matrix layer 60 without a tolerance in all areas excluding the area wherein LEDs 50 are mounted, the area wherein the black matrix layer 60 is formed can be maximized, and accordingly, the expressiveness of the black color of the display can be maximized, and the contrast ratio of the display can be improved.

Further, in a display module and a manufacturing method thereof according to an embodiment of the disclosure, LEDs and electrode pads of driving circuits are electronically connected together with formation of BMs, and thus there is an effect of simplifying processes and reducing the cost.

Figure 3A:
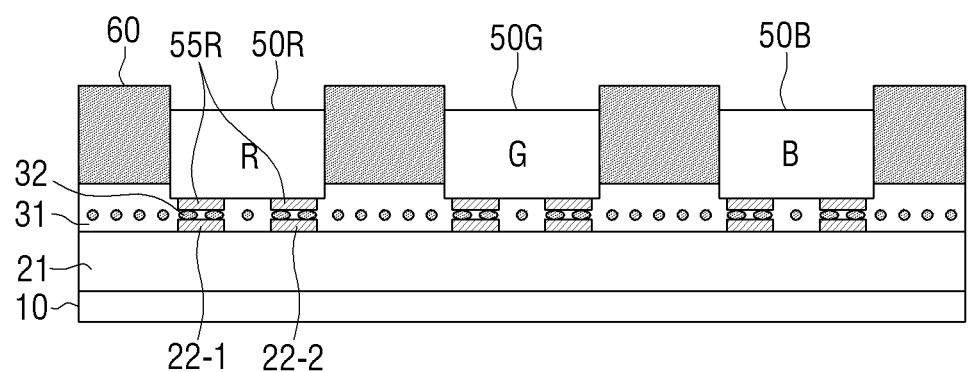
FIG. 3A is a cross-sectional diagram for illustrating connection of a display module according to an embodiment of the disclosure.
Figure 3B:
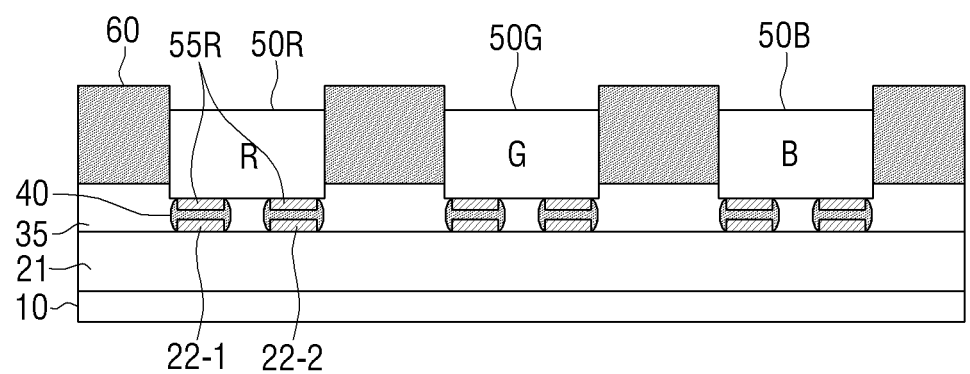
FIG. 3B is a cross-sectional diagram for illustrating connection of a display module according to an embodiment of the disclosure.

FIG. 3A and FIG. 3B are cross-sectional diagrams for illustrating a method of connecting a display module according to an embodiment of the disclosure.

The plurality of driving circuits 21 and the plurality of LEDs 50 included in the display module 1 according to an embodiment of the disclosure may be electronically connected (or joined) with one another by various methods.

As an example, referring to FIG. 3A, the adhesive layer 30 may include an anisotropic conductive film (ACF) 31, and the ACF 31 may include a conductive material 32.

Here, the ACF 31 may refer to an adhesive film wherein the conductive material 32 is arranged to be dispersed. For example, the ACF 31 may be implemented as a general ACF wherein the conductive material 32 inside the ACF 31 is randomly distributed, or an aligned ACF wherein the conductive material 32 inside the ACF 31 is regularly arranged at specific intervals. An adhesive film may be implemented as various resins having adhesiveness.

Here, the conductive material 32 may be implemented in the form of conductive particles or conductive balls having electrical conductivity. Further, the conductive material 32 may be implemented in various ways in forms such as plastic on which conductive particles are coated, etc. For example, the conductive material 32 may be implemented as various materials having electrical conductivity such as Au, Cu, Ni, etc. Meanwhile, the form of the conductive material 32 may be changed by heat or compression.

Meanwhile, the size and the thickness of the ACF 31, the size and the arrangement of the conductive material 32, etc. may be implemented while being modified variously according to the size and the arrangement, etc. of the LEDs 50.

In this case, the plurality of LEDs 50 may be electronically connected to the plurality of electrode pads 22 through the conductive material 32 by a thermo-compression process. For example, the electrode 55R formed in the lower part of the red LED 50R may be electronically connected to the electrode pad 22R of one of the driving circuits 21 through the conductive material 32. Also, with respect to the green LED 50G and the blue LED 50B, explanation for the red LED 50R can be applied in the same manner. With reference to FIG. 3A, each of the electrode pads 22 may include a first electrode pad 22-1 and a second electrode pad 22-2.

As a different example from the above, referring to FIG. 3B, the adhesive layer 30 may include a non-conductive film 35, and the non-conductive film 35 may include a flux. Here, the non-conductive film 35 may be implemented as a thermosetting film that enables joining by an underfill method when the bumps 40 are soldered.

In this case, bumps applied on the electrode of each of the plurality of LEDs 50 or bumps applied on the plurality of electrode pads 22 are melted by a thermo-compression process, and the plurality of LEDs 50 may be electronically connected to the plurality of electrode pads 22 through the bumps 40 while the bumps 40 are in a molten form.

For example, the electrode 55R formed in the lower part of the red LED 50R may be electronically connected to the electrode pad 22R of one of the driving circuits 21 through the bumps 40. Also, with respect to the green LED 50G and the blue LED 50B, explanation for the red LED 50R can be applied in the same manner.

Here, the flux may remove an oxide film that is generated when the bumps 40 are melted. Specifically, the flux may remove pollutants or an oxide film on the surfaces of the bumps 40 in case the bumps 40 are melted (or soldered). For this, the main component of the flux may be, for example, pine resin, and the flux may comprise or consist of materials including a small amount of a halogen activator such as chlorine, fluorine, bromine, etc.

Meanwhile, the bumps 40 may be applied on each electrode 55 of the LEDs 50 or the electrode pads 22 of the driving circuits 21 through screen printing, etc. such that the bumps 40 are located between each electrode 55 of the LEDs 50 and the electrode pads 22 of the driving circuits 21. Afterwards, the bumps are melted as the temperature rises to a temperature higher than or equal to the melting point of the bumps by a thermo-compression process, and when the temperature falls later, the coagulated bumps join between each electrode 55 of the LEDs 50 and the electrode pads 22 of the driving circuits 21, and the LEDs 50 and the driving circuits 21 may be electronically connected with one another.

For this, the bumps 40 may be implemented as conductive powder, etc., and may be implemented as, for example, various materials such as joined Au—In, joined Au—Sn, joined Cu pillar/SnAg bump, joined Ni pillar/SnAg bump, etc.

Meanwhile, the display module 1 according to an embodiment of the disclosure may have an electrode structure for compensating defective pixels in case defective pixels occur. Hereinafter, explanation will be made with reference to FIG. 4A to FIG. 5B. FIG. 5A and FIG. 5B are cross-sectional diagrams for the B1-B2 line of the display module illustrated in FIG. 4A. FIG. 5A illustrates a case wherein the adhesive layer 30 according to an embodiment of the disclosure is the ACF 31 and is connected through the conductive material 32, and FIG. 5B illustrates a case wherein the adhesive layer 30 according to an embodiment of the disclosure is a non-conductive film 35 and is connected through the bumps 40.

Referring to FIG. 4A to FIG. 5B, each of the plurality of electrode pads 22 (e.g., including electrode pad 22R-1 and electrode pad 22R-2) may include one of the first areas 111-1, 111-2, 121-1, 121-2, 131-1, 131-2 for bonding a first LED corresponding to one sub pixel among the plurality of sub pixels (one of red, green, and blue sub pixels) and one of the second areas 112-1, 112-2, 122-1, 122-2, 132-1, 132-2 for bonding a second LED corresponding to the sub pixel in case the first LED is defective.

Meanwhile, the first areas 111-1, 111-2, 121-1, 121-2, 131-1, 131-2 are for dividing the display module in pixel units, and the first areas 111-1, 111-2, 121-1, 121-2, 131-1, 131-2 have structures and functions that are same as one another, unless there is a special circumstance. Likewise, the second areas 112-1, 112-2, 122-1, 122-2, 132-1, 132-2 may also have structures and functions that are same as one another, unless there is a special circumstance.

Here, the second LED may be an LED emitting a light of the same color as the first LED. For example, the first LED and the second LED may be LEDs emitting lights of the same color corresponding to sub pixels (e.g., one of red, green, and blue colors).

Figure 4A:
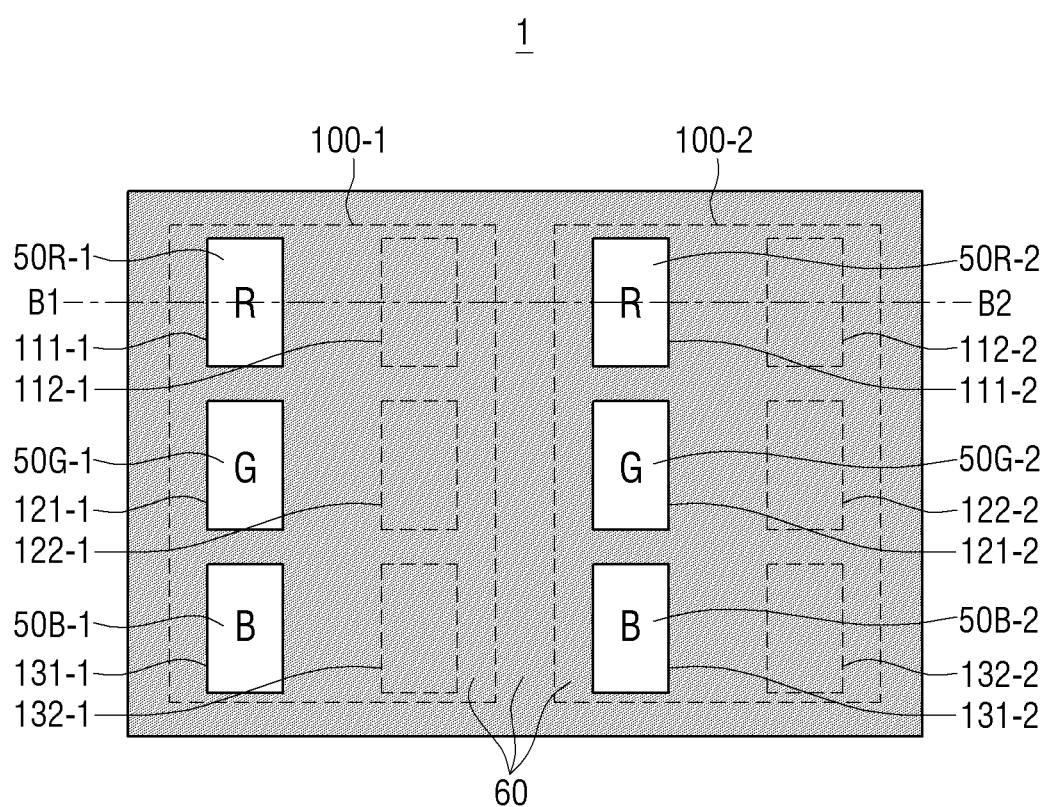
FIG. 4A is a diagram for illustrating a display module for compensating defective pixels according to an embodiment of the disclosure.
Figure 5A:
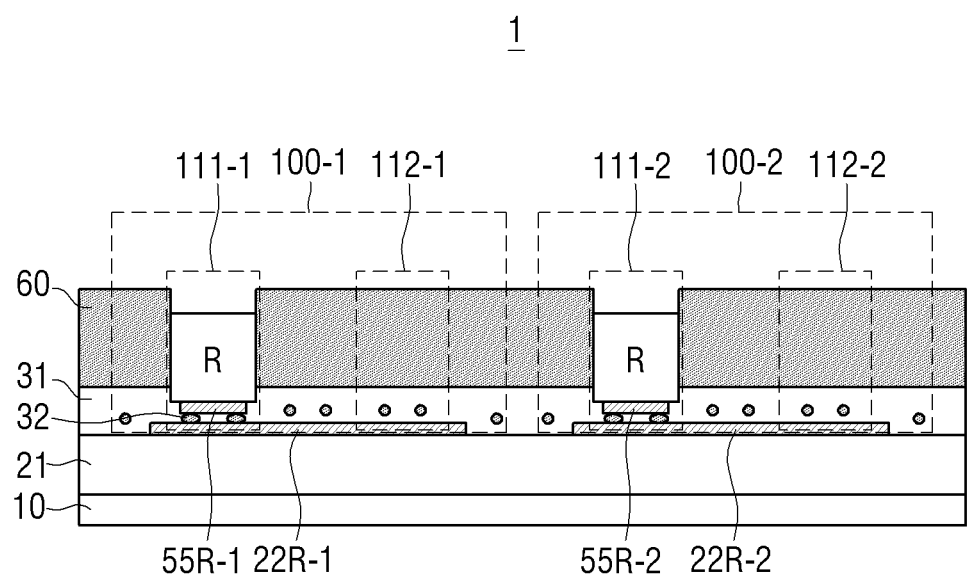
FIG. 5A is a cross-sectional diagram for illustrating a display module for compensating defective pixels according to an embodiment of the disclosure.
Figure 5B:
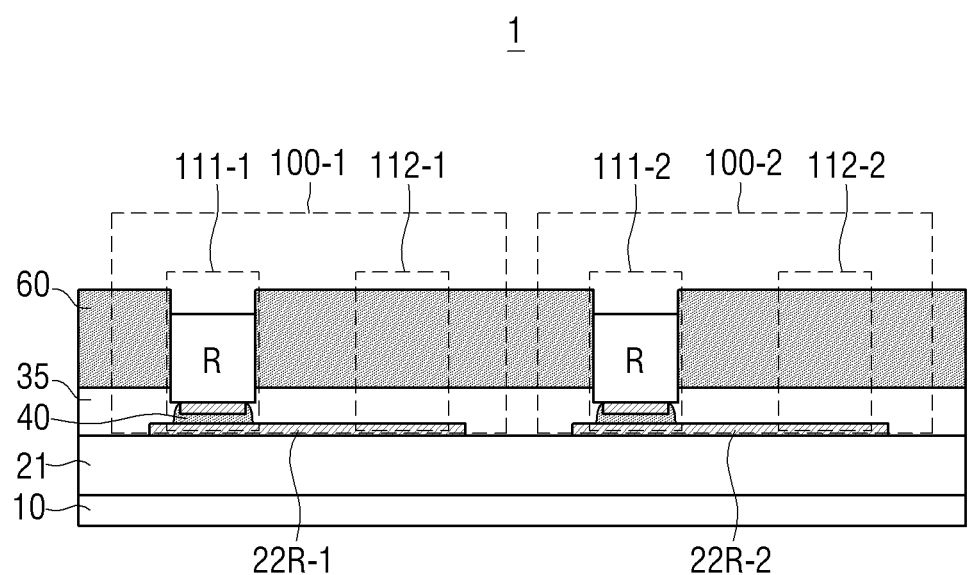
FIG. 5B is a cross-sectional diagram for illustrating a display module for compensating defective pixels according to an embodiment of the disclosure.

Referring to FIG. 4A, FIG. 5A, and FIG. 5B, the display module 1 may include a substrate 10, a driving circuit layer 20 (refer to FIG. 2B as an example), an adhesive layer 30 (refer to FIG. 2B as an example), a plurality of first LEDs (e.g. red LED 50R-1, green LED 50G-1, blue LED 50B-1) bonded to the first areas 111-1, 121-1, 131-1 of the first pixel 100-1 on the adhesive layer 30, a plurality of first LEDs (e.g. red LED 50R-2, green LED 50G-2, blue LED 50B-2) bonded to the first areas 111-2, 121-2, 131-2 of the second pixel 100-2 on the adhesive layer 30, and a black matrix layer 60.

The plurality of first LEDs (e.g., red LED 50R-1, green LED 50G-1, blue LED 50B-1) bonded to the first areas 111-1, 121-1, 131-1 of the first pixel 100-1 may correspond to the plurality of sub pixels (sub pixels of red, green, and blue colors) constituting the first pixel 100-1. Also, the plurality of first LEDs (e.g., red LED 50R-2, green LED 50G-2, blue LED 50B-2) bonded to the first areas 111-2, 121-2, 131-2 of the second pixel 100-2 may correspond to the plurality of sub pixels (sub pixels of red, green, and blue colors) constituting the second pixel 100-2.

Meanwhile, the black matrix layer 60 may be formed in the remaining area excluding the area wherein the plurality of first LEDs (e.g., red LED 50R-1, green LED 50G-1, blue LED 50B-1, red LED 50R-2, green LED 50G-2, blue LED 50B-2) are formed on the adhesive layer 30.

Meanwhile, the thickness (or height) of the black matrix layer 60 illustrated in FIG. 5A and FIG. 5B, etc. is merely an example, and is not limited thereto, and may be implemented while being modified variously as in a case wherein the upper part of the black matrix layer 60 becomes flat without a level difference according to the thickness (or height) of the plurality of LEDs 50 or a case wherein the black matrix layer 60 has the same thickness as the thickness of the LEDs 50.

Meanwhile, the size of each of the plurality of electrode pads 22 (e.g., electrode pad 22R-1 and electrode pad 22R-2) corresponding to respective first red LEDs) is bigger than the size of the first LEDs (e.g., red LED 50R-1, green LED 50G-1, blue LED 50B-1, red LED 50R-2, green LED 50G-2, blue LED 50B-2), respectively. That is, each of the first areas (e.g., first areas 111-1, 111-2, 121-1, 121-2, 131-1, 131-2) and the second areas (e.g., second areas 112-1, 112-2, 122-1, 122-2, 132-1, 132-2) may have a size for mounting the size of the first LED or the second LED.

Also, the first areas (e.g. first areas 111-1, 111-2, 121-1, 121-2, 131-1, 131-2) and the second areas (e.g., second areas 112-1, 112-2, 122-1, 122-2, 132-1, 132-2) of each of the plurality of electrode pads 22 may be electronically connected with one another. That is, each of the electrode pads 22 may be formed to be long in one direction (e.g., the width direction, etc.).

Figure 4B:
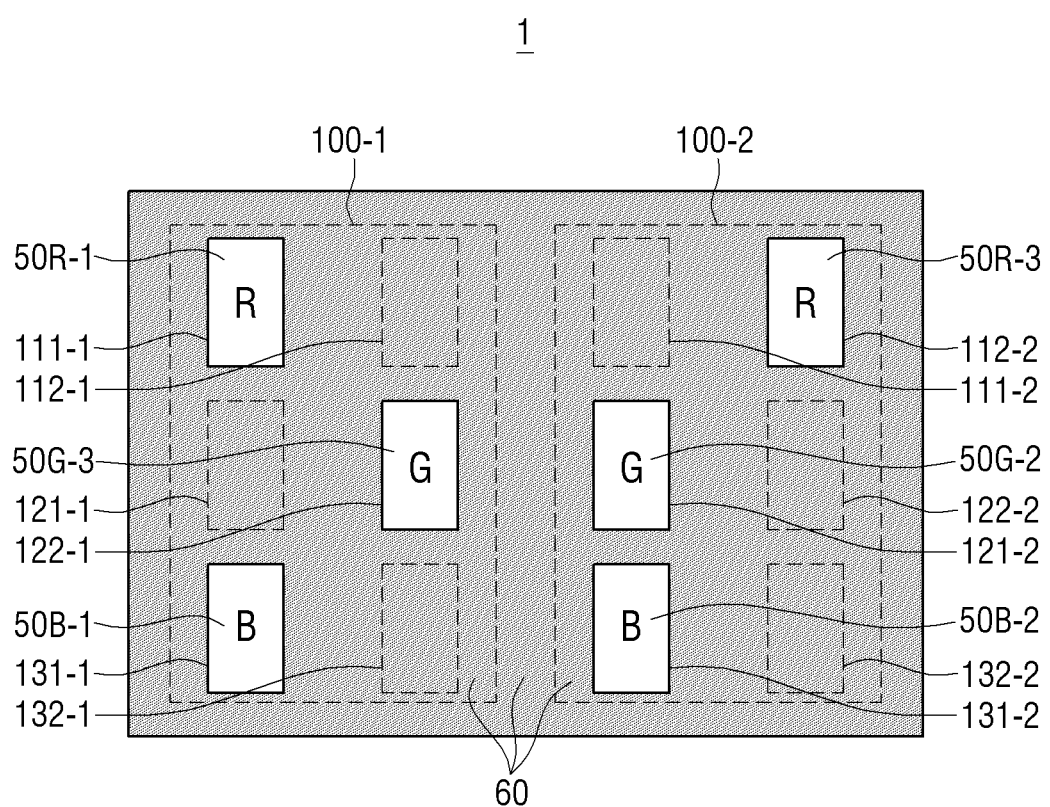
FIG. 4B is a diagram for illustrating a display module for compensating defective pixels according to an embodiment of the disclosure.

Meanwhile, with reference to FIG. 4B, explanation will be made by assuming a case wherein the green LED 50G-1 bonded to the first area 121-1 of the first pixel 100-1 and the red LED 50R-2 bonded to the first area 111-2 of the second pixel 100-2 are defective among the plurality of first LEDs illustrated in FIG. 4A.

Here, the green LED 50G-1 of the first pixel 100-1 and the red LED 50R-2 of the second pixel 100-2, which are defective, may be replaced by including, in the display module 1, the green LED 50G-3 bonded to the second area 122-1 of the first pixel 100-1, and the red LED 50R-3 bonded to the second area 112-2 of the second pixel 100-2. Here, the green LED 50G-1 of the first pixel 100-1 and the red LED 50R-2 of the second pixel 100-2 which are defective may be removed by a laser method, etc.

In this case, the black matrix layer 60 may also be formed in the remaining area excluding the area wherein the plurality of first LEDs (e.g., red LED 50R-1, green LED 50G-1, blue LED 50B-1, red LED 50R-2, green LED 50G-2, blue LED 50B-2) are formed on the adhesive layer 30.

FIG. 6 is a flow chart for illustrating a method of manufacturing a display panel according to an embodiment of the disclosure.

Referring to FIG. 6, a manufacturing method of the display module 1 including the plurality of pixels (e.g., including a first pixel 100-1 and a second pixel 100-2) according to the disclosure may include the steps of: forming a driving circuit layer 20 including a plurality of driving circuits 21 and a plurality of electrode pads 22 electronically connected with each of the plurality of driving circuits 21 on a substrate 10 (S610); forming an adhesive layer 30 on the driving circuit layer 20 (S620); transferring each of a plurality of LEDs 50 on an area of the adhesive layer 30 corresponding to the plurality of electrode pads 22 (S630); attaching a black matrix layer 70, attached to a film 80, on the adhesive layer 30, formed between the plurality of LEDs 50, and the plurality of LEDs 50 (S640); and removing the black matrix layer 71, 72, attached on the plurality of LEDs 50, together with the film 80, and thereby forming the black matrix layer 60 on the adhesive layer 30 formed between the plurality of LEDs 50 (S650).

Here, each of the plurality of pixels (e.g., including a first pixel 100-1 and a second pixel 100-2) may include a plurality of sub pixels, and each of the plurality of electrode pads 22 may include one of first areas 111, 121, 131 for bonding a first LED corresponding to a sub pixel among the plurality of sub pixels and one of second areas 112, 122, 132 for bonding a second LED corresponding to the sub pixel in case the first LED is defective.

Hereinafter, each step of the manufacturing method of a display module according to the disclosure will be described with reference to the accompanying drawings.

Figure 7A:
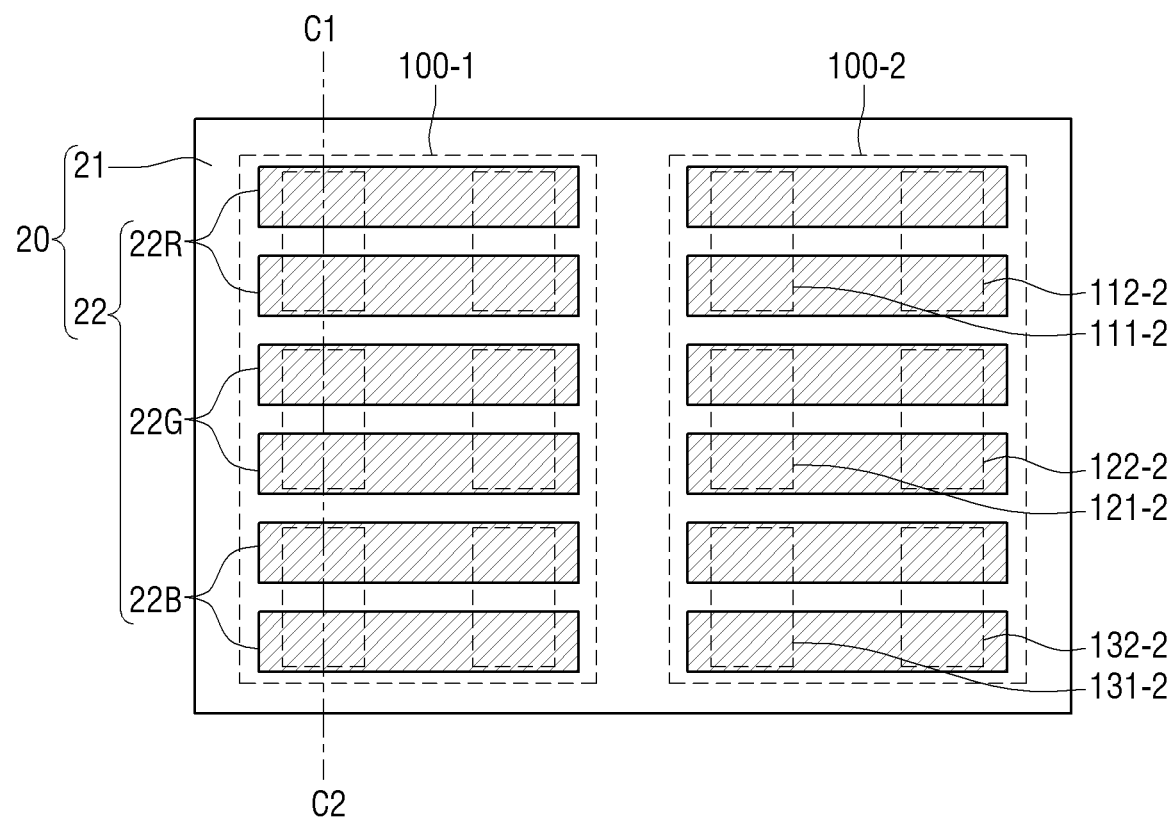
FIG. 7A is a diagram for illustrating a driving circuit layer according to an embodiment of the disclosure.
Figure 7B:
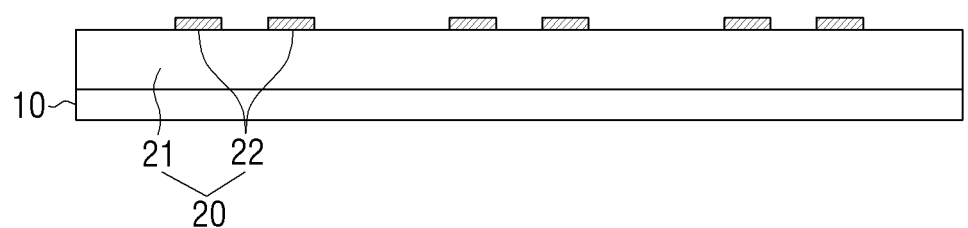
FIG. 7B is a cross-sectional diagram for illustrating the driving circuit layer according to an embodiment of the disclosure.
Figure 7C:
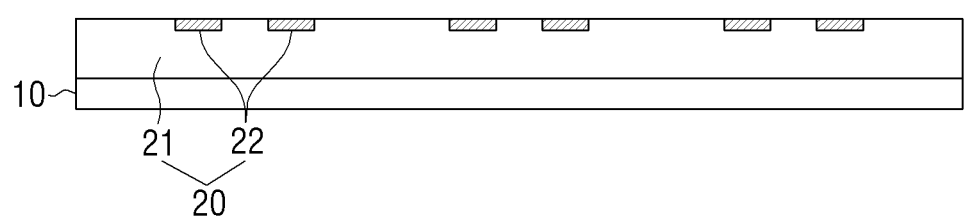
FIG. 7C is a cross-sectional diagram for illustrating the driving circuit layer according to an embodiment of the disclosure.

FIG. 7A to FIG. 7C are diagrams for illustrating a driving circuit layer according to an embodiment of the disclosure. Here, FIG. 7B and FIG. 7C are cross-sectional diagrams for the C1-C2 line in FIG. 7A.

Referring to FIG. 7A to FIG. 7C, first, a driving circuit layer 20 may be formed on the substrate 10 at operation S610. Here, the driving circuit layer 20 may include a plurality of driving circuits 21 and a plurality of electrode pads 22 electronically connected with each of the plurality of driving circuits 21.

The plurality of driving circuits 21 are constituted as circuits for transmitting a driving signal for making the plurality of LEDs 50 emit lights, and may be formed through various processes such as drilling, plating, exposure, etching, laminating, etc. The plurality of driving circuits 21 may be implemented as circuits in various forms according to design of the circuits.

The plurality of electrode pads 22 are electronically connected with the plurality of driving circuits 21, and may be implemented as various materials having high electrical conductivity such as Cu, Au, Ag, Indium Tin Oxide (ITO), etc.

For this, the plurality of electrode pads 22 may be formed through a plating process, a depositing process, a sputtering process, etc. Also, the plurality of electrode pads 22 may be formed in a location for bonding (or transferring) the plurality of LEDs 50.

Figure 8A:
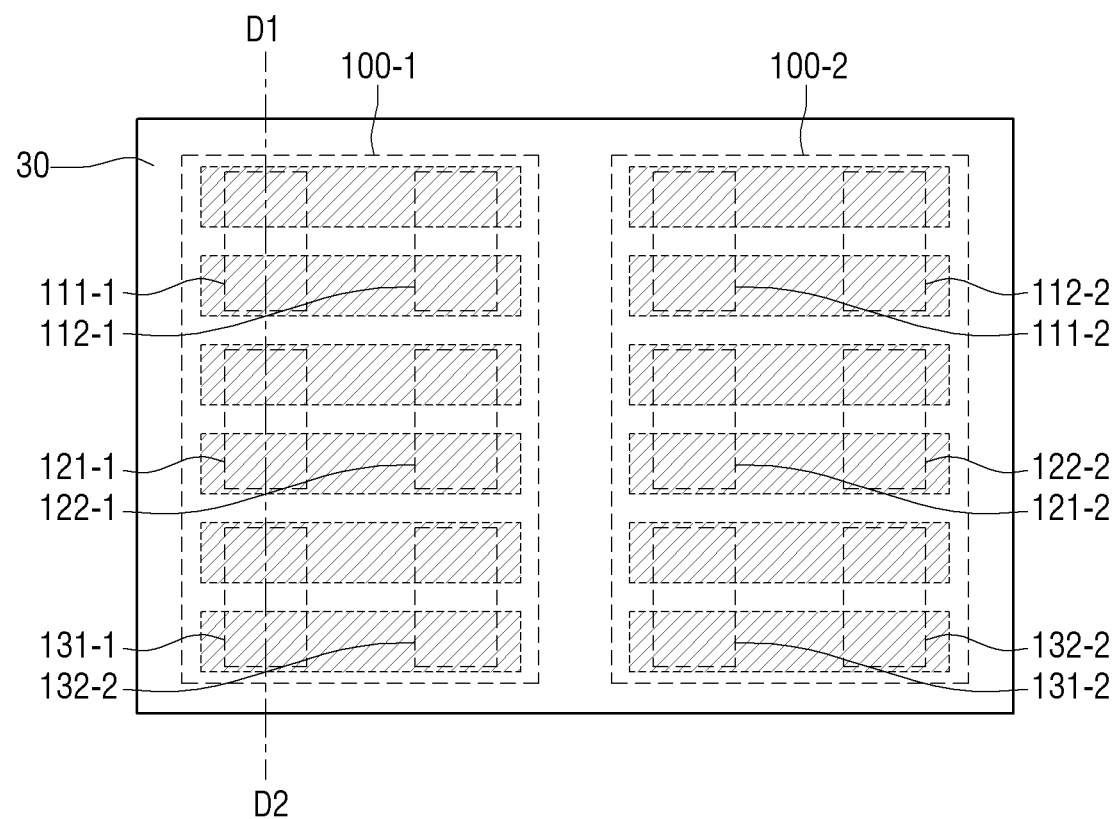
FIG. 8A is a diagram for illustrating a method of forming an adhesive layer according to an embodiment of the disclosure.

Also, each of the plurality of electrode pads 22 may include one of first areas 111-1, 111-2, 121-1, 121-2, 131-1, 131-2 for bonding a first LED corresponding to one sub pixel among the plurality of sub pixels and one of second areas 112-1, 112-2, 122-1, 122-2, 132-1, 132-2 for bonding a second LED corresponding to the sub pixel in case the first LED is defective (refer to FIG. 7A and FIG. 8A as examples). Here, the second LED may be an LED emitting a light of the same color as the first LED.

Here, the size of each of the plurality of electrode pads 22 is bigger than the size of the first LED. That is, each of the first areas 111, 121, 131 and the second areas 112, 122, 132 may have a size for mounting the size of the first LED or the second LED.

Also, the first area from among the first areas 111, 121, 131 and the second area from among the second areas 112, 122, 132 of each of the plurality of electrode pads 22 may be electronically connected with one another. That is, each of the electrode pads 22 may be formed to be long in one direction (e.g.: the width direction, etc.).

Meanwhile, according to an embodiment of the disclosure, as in FIG. 7B, the plurality of electrode pads 22 may be formed to project on the upper surface of the driving circuit layer 20, or according to another embodiment of the disclosure, as in FIG. 7C, the plurality of electrode pads 22 may be formed to not project on the upper surface of the driving circuit layer 20 (that is, to be flat without a level difference from the upper surface of the driving circuit layer 20).

Figure 8B:
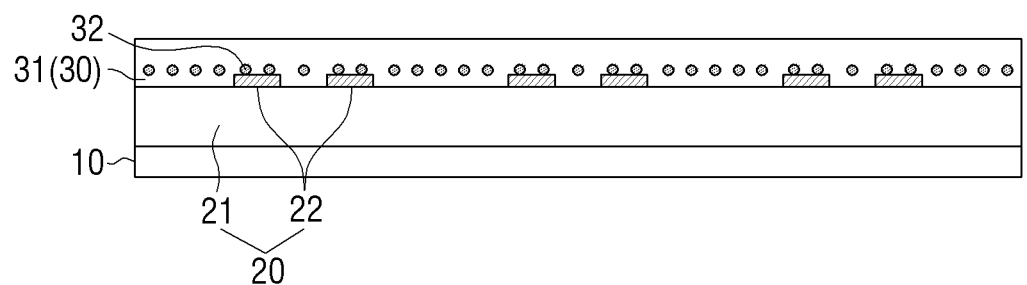
FIG. 8B is a cross-sectional diagram for illustrating a method of forming an adhesive layer according to an embodiment of the disclosure.
Figure 8C:
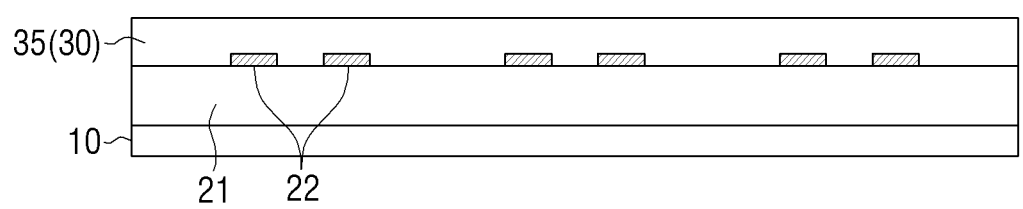
FIG. 8C is a cross-sectional diagram for illustrating a method of forming an adhesive layer according to an embodiment of the disclosure.
Figure 8D:
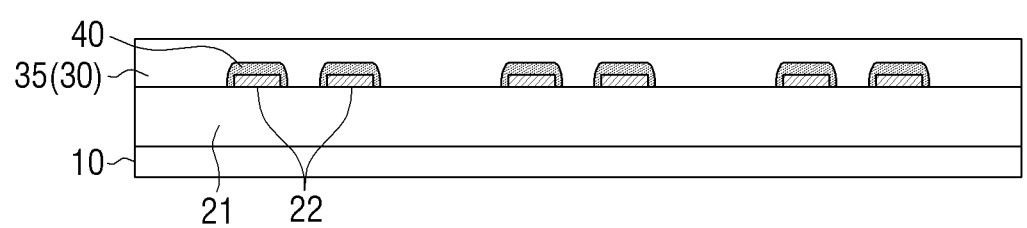
FIG. 8D is a cross-sectional diagram for illustrating a method of forming an adhesive layer according to an embodiment of the disclosure.

FIG. 8A to FIG. 8D are diagrams for illustrating a method of forming an adhesive layer according to an embodiment of the disclosure. Here, FIG. 8B illustrates a case wherein the adhesive layer 30 according to an embodiment of the disclosure is the ACF 31, and FIG. 8C and FIG. 8D illustrate a case wherein the adhesive layer 30 according to an embodiment of the disclosure is the non-conductive film 35. Here, FIGS. 8B-D are cross-sectional diagrams for the D1-D2 line in FIG. 8A according to embodiments.

Referring to FIG. 8A to FIG. 8D, the adhesive layer 30 may be formed on the driving circuit layer 20 at operation S620 after the operation S610.

For example, the adhesive layer 30 may be formed as an adhesive film (not shown) is laminated on the driving circuit layer 20. Here, the adhesive film may be the ACF 31 illustrated in FIG. 8B or the non-conductive film 35 illustrated in FIG. 8C and FIG. 8D.

Here, laminating may refer to a method of forming a layer by covering a film on the surface of an object which is the subject. Specifically, laminating may follow a roll laminating method of making an adhesive film located on the driving circuit layer 20 pass through a roller together with the driving circuit layer 20 and attaching the adhesive film on the driving circuit layer 20, a vacuum laminating method of attaching an adhesive film on the driving circuit layer 20 by using vacuum, etc. However, these are merely an example, and laminating is not limited thereto, but may be implemented in various ways such as a roller, vacuum, heating or cooling, or a combination thereof.

Meanwhile, after an adhesive film is attached on the driving circuit layer 20, in case bubbles exist between the adhesive film and the driving circuit layer 20, the bubbles may be removed by using an autoclave method. For example, bubbles may be removed through a constant temperature pressurizing process of applying pressure while maintaining the temperature to be constant or a heating and pressurizing process of applying pressure while raising the temperature, etc.

With reference to FIG. 8B, a case where the adhesive layer 30 according to an embodiment of the disclosure is the ACF 31 is illustrated.

Referring to FIG. 8B, the ACF 31 formed on the driving circuit layer 20 as above may include a conductive material 32. Here, the conductive material 32 may be arranged randomly or at regular intervals, and some of the conductive material 32 may be arranged on the electrode pads 22.

With reference to FIG. 8C and FIG. 8D, a case wherein the adhesive layer 30 according to an embodiment of the disclosure is the non-conductive film 35 is illustrated.

Referring to FIG. 8C and FIG. 8D, the non-conductive film 35 may include a flux. Here, the flux may remove an oxide film that is generated when the bumps 40 are melted.

Figure 9A:
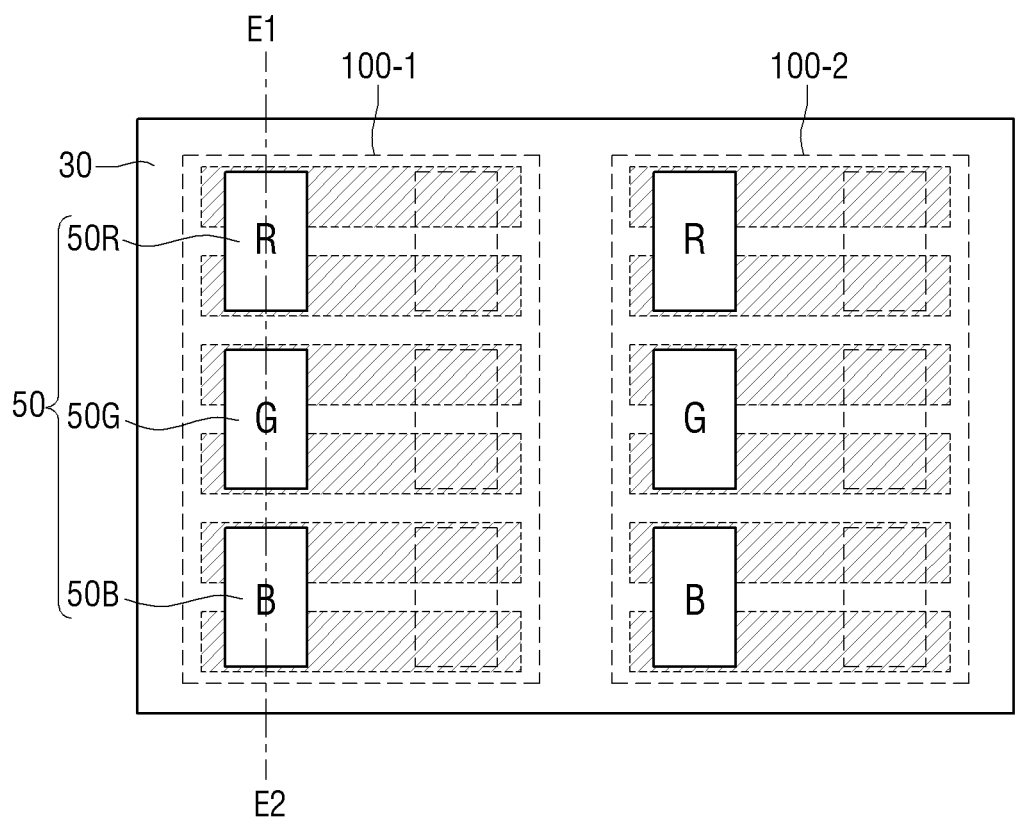
FIG. 9A is a diagram for illustrating a method of transferring LEDs according to an embodiment of the disclosure.
Figure 9B:
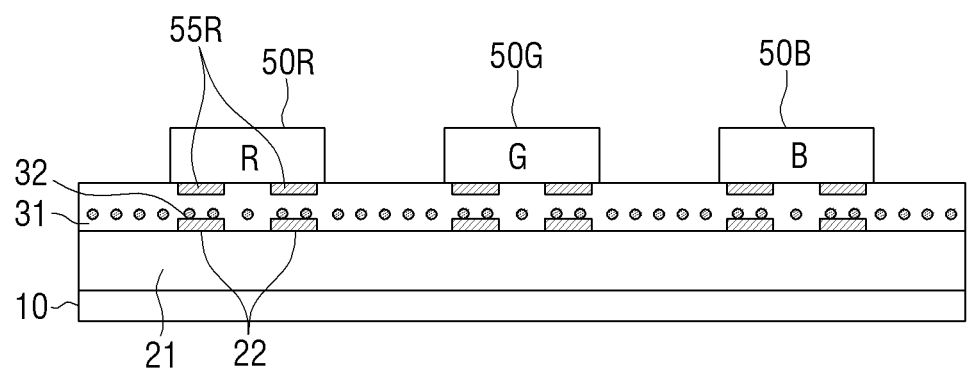
FIG. 9B is a cross-sectional diagram for illustrating a method of transferring LEDs according to an embodiment of the disclosure.
Figure 9C:
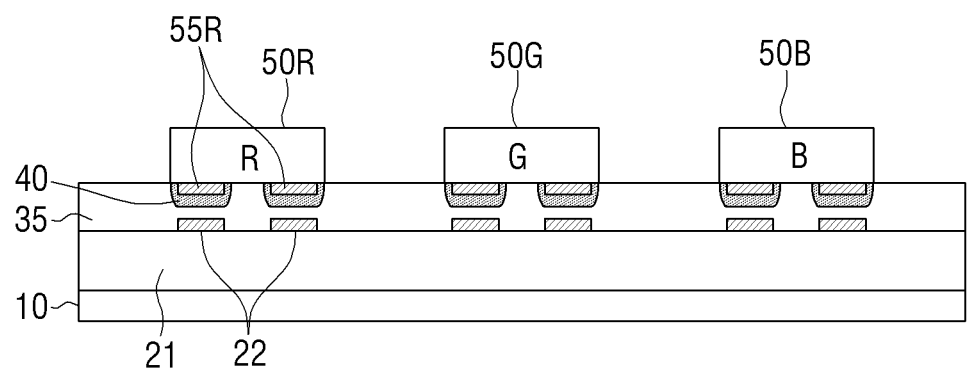
FIG. 9C is a cross-sectional diagram for illustrating a method of transferring LEDs according to an embodiment of the disclosure.
Figure 9D:
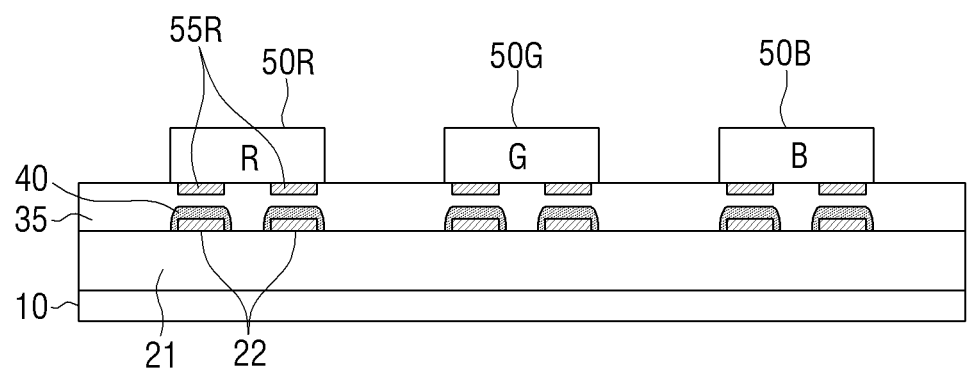
FIG. 9D is a cross-sectional diagram for illustrating a method of transferring LEDs according to an embodiment of the disclosure.
Figure 10A:
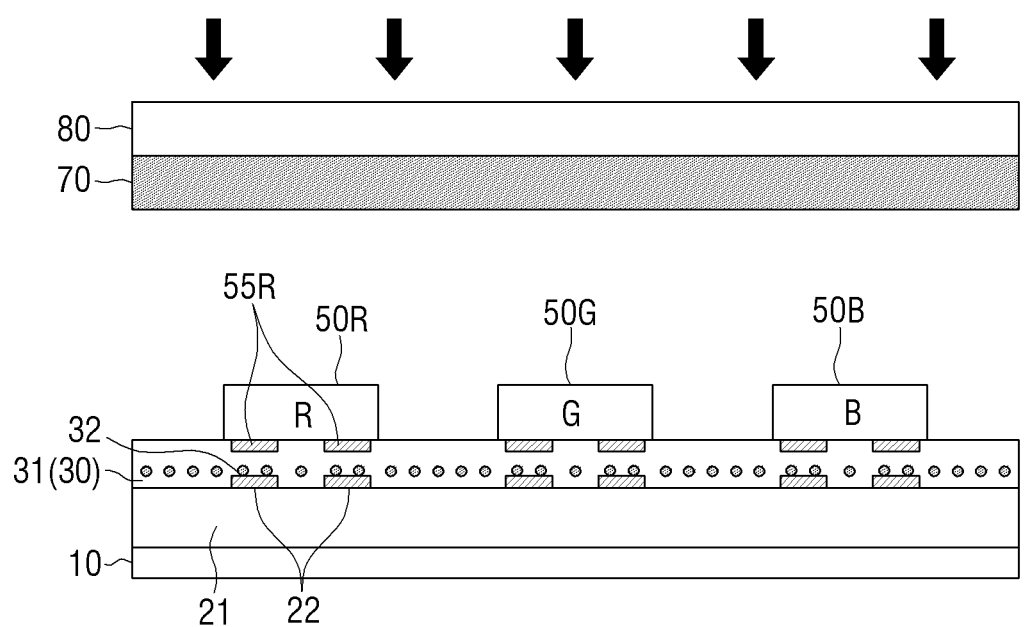
FIG. 10A is a cross-sectional diagram for illustrating a method of attaching a film according to an embodiment of the disclosure.
Figure 10B:
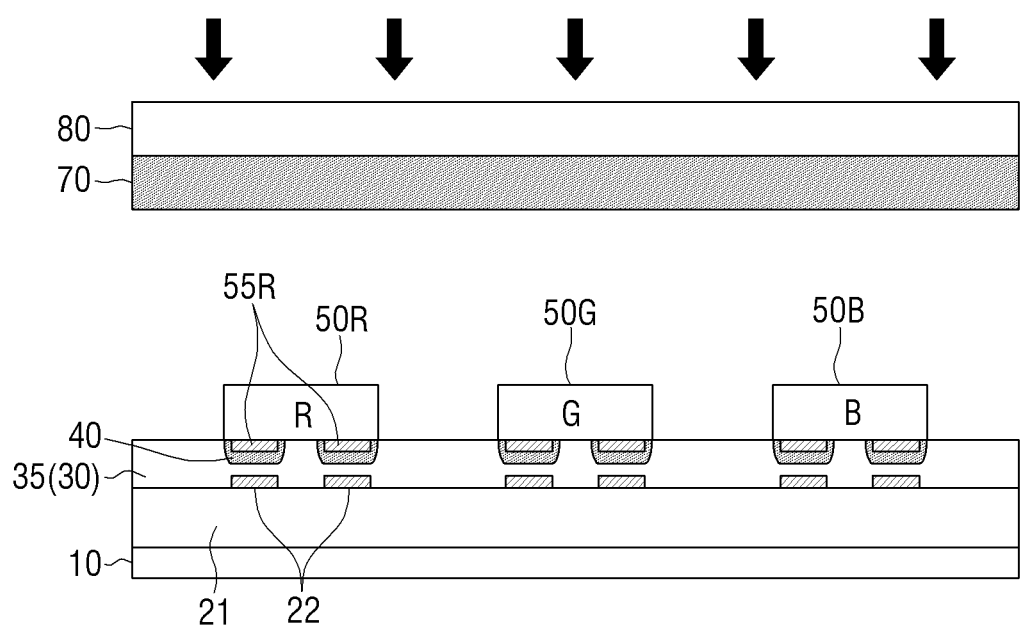
FIG. 10B is a cross-sectional diagram for illustrating a method of attaching a film according to an embodiment of the disclosure.
Figure 10C:
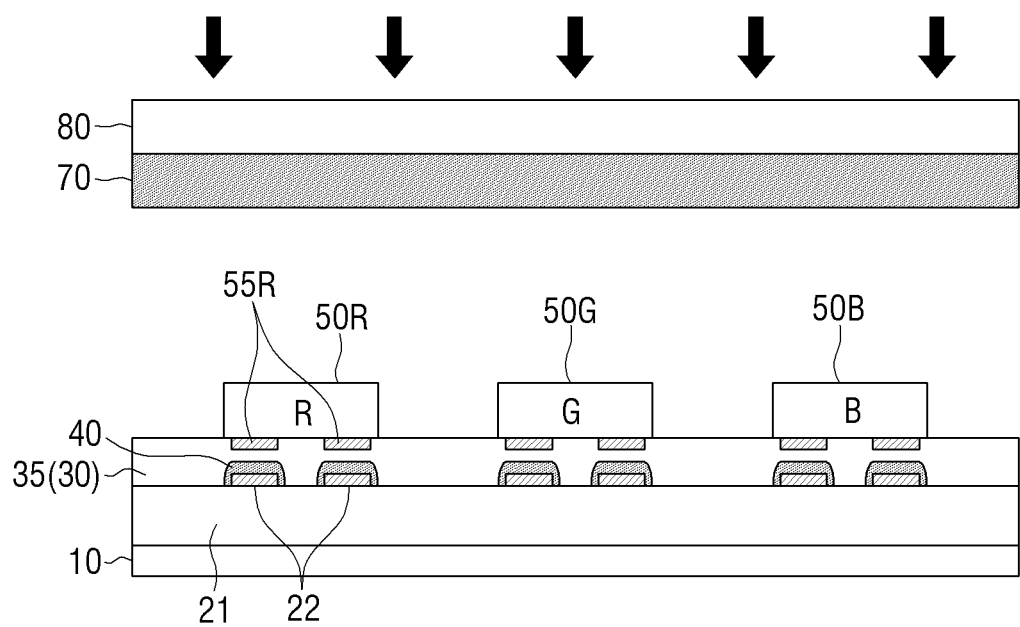
FIG. 10C is a cross-sectional diagram for illustrating a method of attaching a film according to an embodiment of the disclosure.

For this, the bumps 40 may be applied on the electrode of each of the plurality of LEDs 50 (e.g., red LED 50R, green LED 50G, blue LED 50B illustrated in FIG. 9C and FIG. 10), or applied on the plurality of electrode pads 22 (refer to FIG. 8D, FIG. 9D, FIG. 10C). In this case, the bumps 40 may be applied after the adhesive layer 30 is formed on the driving circuit layer 20 (after the operation S620) as in FIG. 8C, or it is also possible that the bumps 40 are applied before the adhesive layer 30 is formed on the driving circuit layer 20 (before the operation S620) as in FIG. 8D.

FIG. 9A to FIG. 9D are diagrams for illustrating a method of transferring LEDs according to an embodiment of the disclosure. Here, FIG. 9B illustrates a case wherein the adhesive layer 30 according to an embodiment of the disclosure is the ACF 31, and FIG. 9C and FIG. 9D illustrate a case wherein the adhesive layer 30 according to an embodiment of the disclosure is the non-conductive film 35. Here, FIGS. 9B-D are cross-sectional diagrams for the E1-E2 line in FIG. 9A according to embodiments.

Referring to FIG. 9A to FIG. 9D, after the operation S620, each of the plurality of LEDs 50 (e.g., red LED 50R, green LED 50G, blue LED 50B) may be transferred to an area of the adhesive layer 30 corresponding to the plurality of electrode pads 22 at operation S630. Here, each of the plurality of LEDs 50 may be a micro LED of a flip-chip structure wherein the electrode 55 (e.g., electrode 55R of the red LED 50R) is formed in the lower part.

Specifically, the plurality of LEDs 50 may be transferred to an area of the adhesive layer 30 corresponding to the plurality of electrode pads 22, such that they are electronically connected with the plurality of electrode pads 22 through operation S640.

For example, the plurality of LEDs 50 may be formed in an area wherein the electrode pads of the plurality of LEDs 50 and the plurality of electrode pads 22 of the driving circuits 21 directly contact with one another, or indirectly contact through an electrically conductive material. Here, the electrically conductive material may be the conductive material 32 or the bumps 40.

Here, an area wherein the plurality of LEDs 50 and the plurality of electrode pads 22 of the driving circuits 21 are electronically connected may be the first area among the first areas 111, 121, 131 of each of the plurality of pixels (e.g., including a first pixel 100-1 and a second pixel 100-2) existing on the plurality of electrode pads 22 or the second area among the second areas 112, 122, 132 of each of the plurality of pixels (e.g., including a first pixel 100-1 and a second pixel 100-2).

Figure 11A:
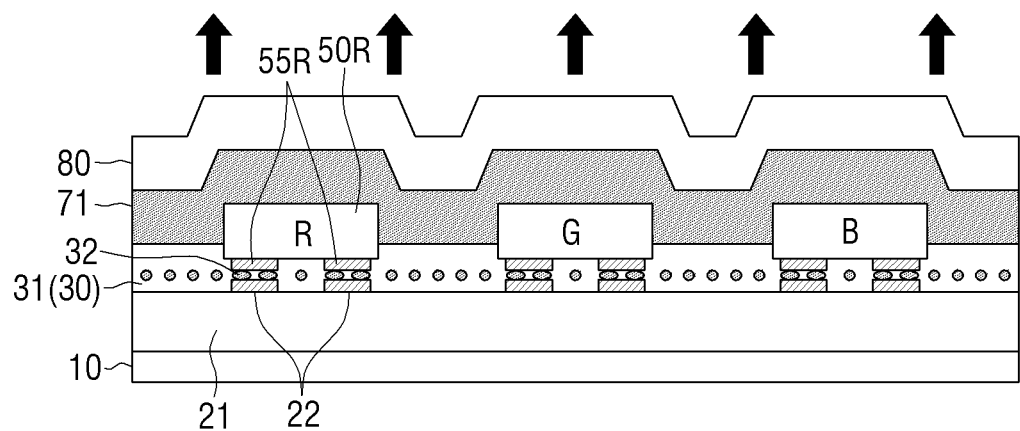
FIG. 11A is a cross-sectional diagram for illustrating a method of forming a black matrix layer according to an embodiment of the disclosure.
Figure 11B:
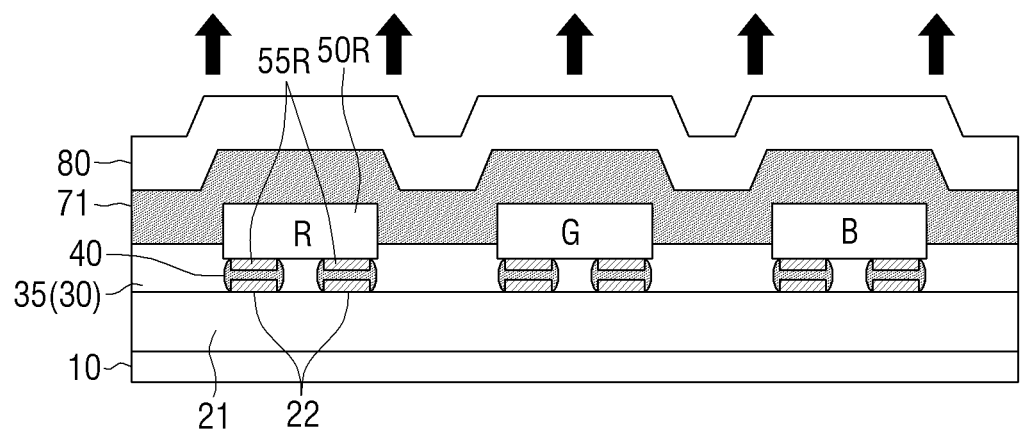
FIG. 11B is a cross-sectional diagram for illustrating a method of forming a black matrix layer according to an embodiment of the disclosure.

FIG. 10A to FIG. 10C are diagrams for illustrating a method of attaching a film according to an embodiment of the disclosure. FIG. 11A and FIG. 11B are diagrams for illustrating a method of forming a black matrix layer according to an embodiment of the disclosure. Here, FIG. 10A and FIG. 11A illustrate a case wherein the adhesive layer 30 according to an embodiment of the disclosure is the ACF 31, and FIG. 10B, FIG. 10C, and FIG. 11B illustrate a case wherein the adhesive layer 30 according to an embodiment of the disclosure is the non-conductive film 35.

Referring to FIG. 10A to FIG. 10C, after the operation S630, the black matrix layer 70 attached to the film 80 may be attached on an area (or called "a gap area") of the adhesive layer 30, formed between the plurality of LEDs 50 (e.g., red LED 50R, green LED 50G, blue LED 50B), and the plurality of LEDs 50 at operation S640.

Here, through a thermo-compression process, the black matrix layer 60 may be attached on the adhesive layer 30 formed between the plurality of LEDs 50R, 50G, 50B and the plurality of LEDs 50R, 50G, 50B.

Here, the thermo-compression process may refer to a method of locating the black matrix layer 70 on the adhesive layer 30, formed between the plurality of LEDs 50, and the plurality of LEDs 50, and applying pressure and heat to the film 80 attached on the black matrix layer 70 in the direction of the substrate 10, as in FIG. 10A to FIG. 10C.

For this, the film 80 may be a release film having the property of heat resistance, and it may be implemented as, for example, a film including at least one of polymers such as Teflon, polyimide, polyolefin, etc.

Afterwards, when heat and pressure are applied through a thermo-compression process, a form illustrated in FIG. 11A to FIG. 11B may be made.

Hereinafter, a case wherein the adhesive layer 30 includes the ACF 31 will be explained with reference to FIG. 11A. Here, the ACF 31 may include the conductive material 32, and the conductive material 32 may be implemented in forms such as plastic on which conductive particles are coated, etc.

In this case, by a thermo-compression process, the black matrix layer 71 (previously referred to as the black matrix layer 70) may be attached on the adhesive layer 30, formed between the plurality of LEDs 50 (e.g. red LED 50R, green LED 50G, blue LED 50B), and the plurality of LEDs 50, and each of the plurality of LEDs 50 may be electronically connected to the plurality of electrode pads 22 through the conductive material 32.

Here, the plurality of LEDs 50 and the plurality of electrode pads 22 may respectively contact the conductive material 32 existing in between, and accordingly, the plurality of LEDs 50 may be electronically connected with the plurality of electrode pads 22 through the conductive material 32.

Also, the ACF 31 may be cured by the thermo-compression process, and its adhesive force may be improved.

Hereinafter, a case wherein the adhesive layer 30 includes the non-conductive film 35 will be explained with reference to FIG. 11B. Here, the non-conductive film 35 may include a flux, and the flux may remove an oxide film that is generated when the bumps 40 are melted.

In this case, by a thermo-compression process, the black matrix layer 71 (previously referred to as the black matrix layer 70) may be attached on the adhesive layer 30, formed between the plurality of LEDs 50, and the plurality of LEDs 50, and the bumps 40 applied on the electrode of each of the plurality of LEDs 50 or the bumps 40 applied on the plurality of electrode pads 22 may be melted, and each of the plurality of LEDs 50 may be electronically connected to the plurality of electrode pads 22 through the bumps 40 while the bumps 40 are in a molten form.

Here, when the bumps 40 are melted, an oxide film may be generated on the surface. In this case, the oxide film of the bumps 40 (or the oxide film of the surface) may generate problems that wetting of solder constituting the bumps 40 is reduced, and a gap is generated between the bumps 40 and the electrodes and the strength of joining is reduced.

In this case, the oxide film that is generated when the bumps 40 are melted may be removed by the flux. Also, the flux may remove the oxide film, or prevent generation of the oxide film physicochemically.

Figure 12A:
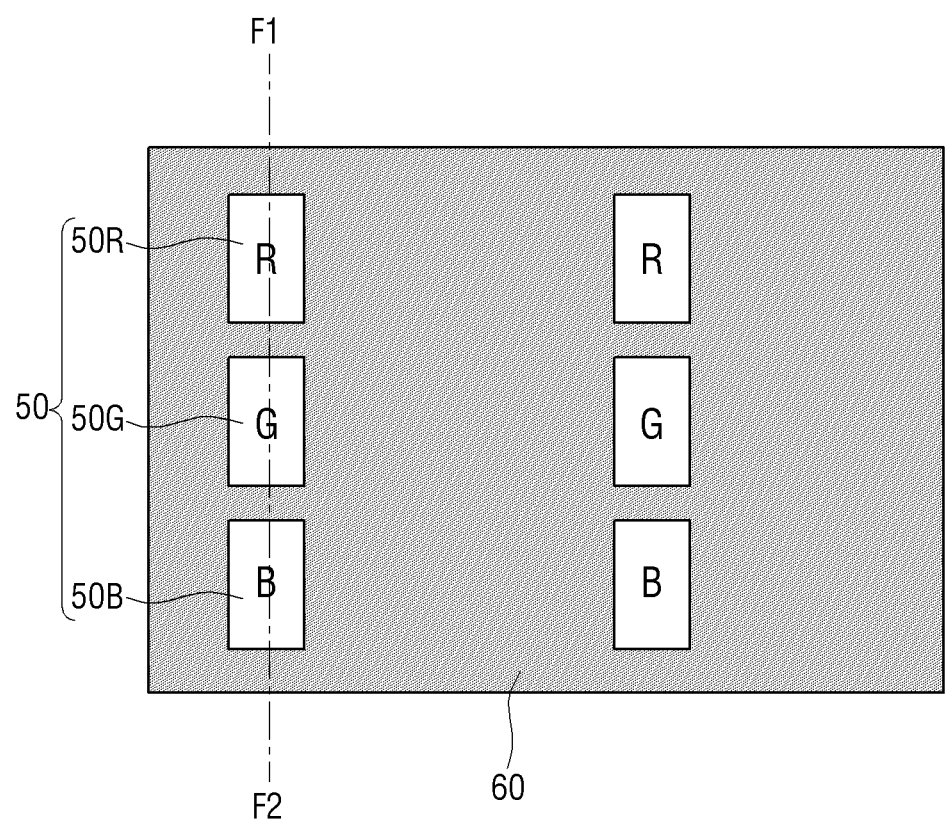
FIG. 12A is a diagram for illustrating a display module manufactured according to an embodiment of the disclosure.
Figure 12B:
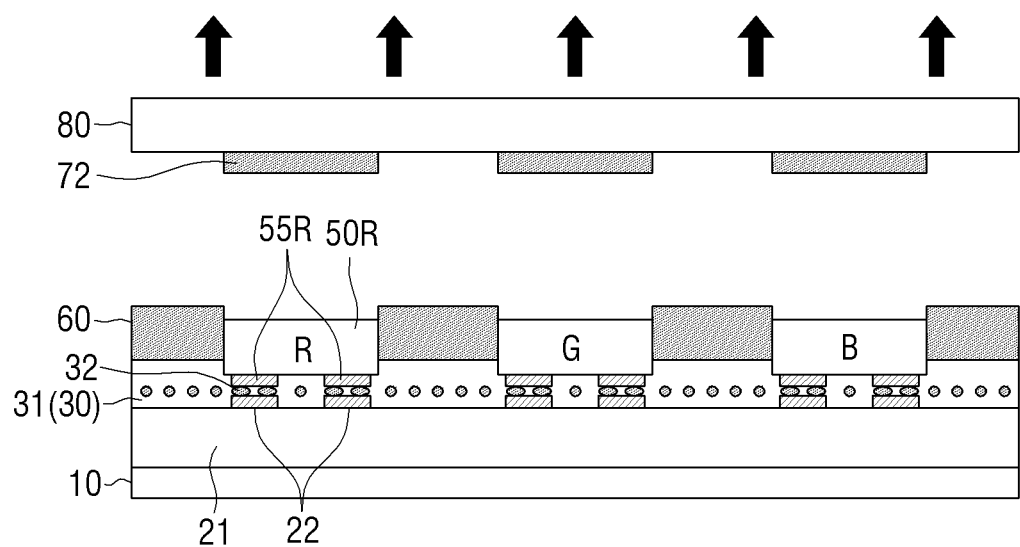
FIG. 12B is a cross-sectional diagram for illustrating a display module manufactured according to an embodiment of the disclosure.
Figure 12C:
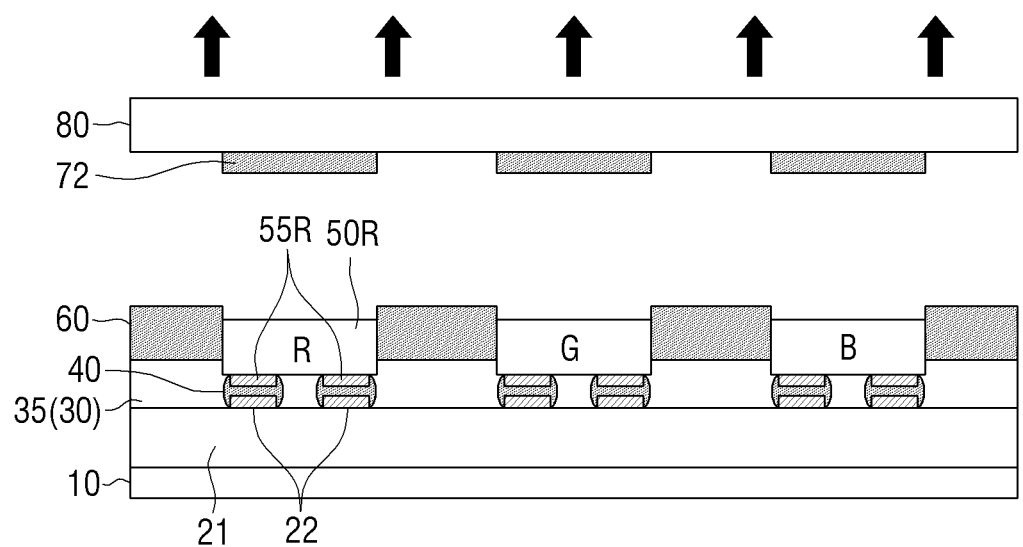
FIG. 12C is a cross-sectional diagram for illustrating a display module manufactured according to an embodiment of the disclosure.

FIG. 12A to FIG. 12C are diagrams for illustrating a display module manufactured according to an embodiment of the disclosure. Here, FIG. 12A illustrates a case wherein the adhesive layer 30 according to an embodiment of the disclosure is the ACF 31, and FIG. 12B illustrate a case wherein the adhesive layer 30 according to an embodiment of the disclosure is the non-conductive film 35. Here, FIGS. 12B-C are cross-sectional diagrams for the F1-F2 line in FIG. 12A according to embodiments.

Referring to FIG. 12A to FIG. 12C, after the operation S640, the black matrix layer 72 (e.g., a portion of the black matrix layer 71) attached on the plurality of LEDs 50 (e.g. red LED 50R, green LED 50G, blue LED 50B) may be removed together with the film 80, and the black matrix layer 60 (e.g., a remaining portion of the black matrix layer 71) may be formed on the adhesive layer 30, formed between the plurality of LEDs 50, at operation S650.

Here, the adhesive force between the adhesive layer 30 and the black matrix layer 60 attached on the adhesive layer 30 may be stronger than the adhesive force between the film 80 and the black matrix layer 72 attached to the film 80. Accordingly, when the film 80 is removed, the black matrix layer 60 attached on the adhesive layer 30 may remain.

Also, the adhesive force between the plurality of LEDs 50 and the black matrix layer 72 attached on the plurality of LEDs 50 may be weaker than the adhesive force between the film 80 and the black matrix layer 72. Accordingly, when the film 80 is removed, the black matrix layer 72 attached on the plurality of LEDs 50 may be removed with the film 80.

According to an embodiment of the disclosure as above, as the black matrix layer 60 is formed by forming the adhesive layer 30 in the entire area of the driving circuit layer 20, attaching the plurality of LEDs 50 on the adhesive layer 30, and by using the adhesive force of the exposed part of the adhesive layer 30, generation of a BM opening area wherein a black matrix is not formed between the plurality of LEDs 50 can be minimized. That is, by forming the black matrix layer 60 without a tolerance in all areas excluding the area wherein LEDs are mounted, the area wherein the black matrix layer 60 is formed can be maximized, and accordingly, the expressiveness of the black color of the display can be maximized, and the contrast ratio of the display can be improved.

Also, in a display module and a manufacturing method thereof according to an embodiment of the disclosure, LEDs and electrode pads of driving circuits are electronically connected together with formation of BMs, and thus there is an effect of simplifying processes and reducing the cost.

Figure 13A:
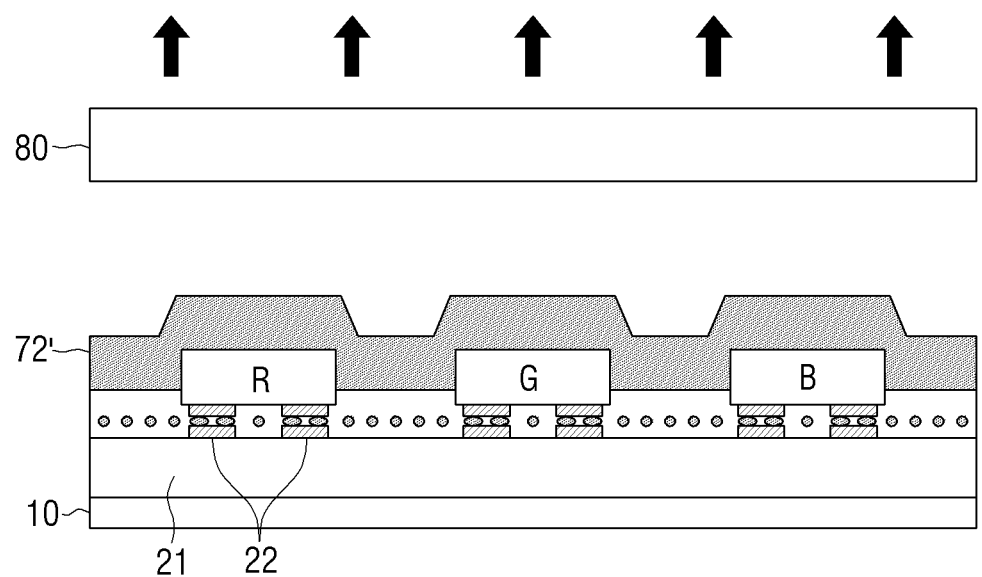
FIG. 13A is a cross-sectional diagram for illustrating a method of forming a black matrix layer according to an embodiment of the disclosure.
Figure 13B:
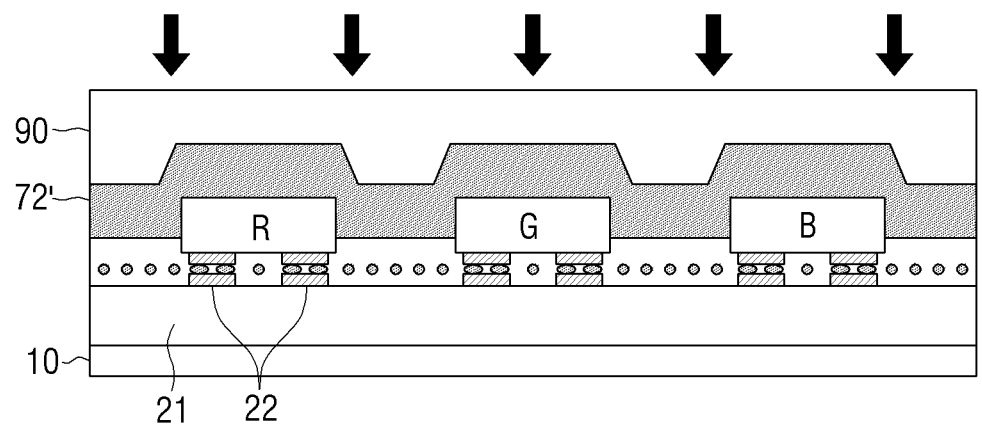
FIG. 13B is a cross-sectional diagram for illustrating a method of forming a black matrix layer according to an embodiment of the disclosure.
Figure 13C:
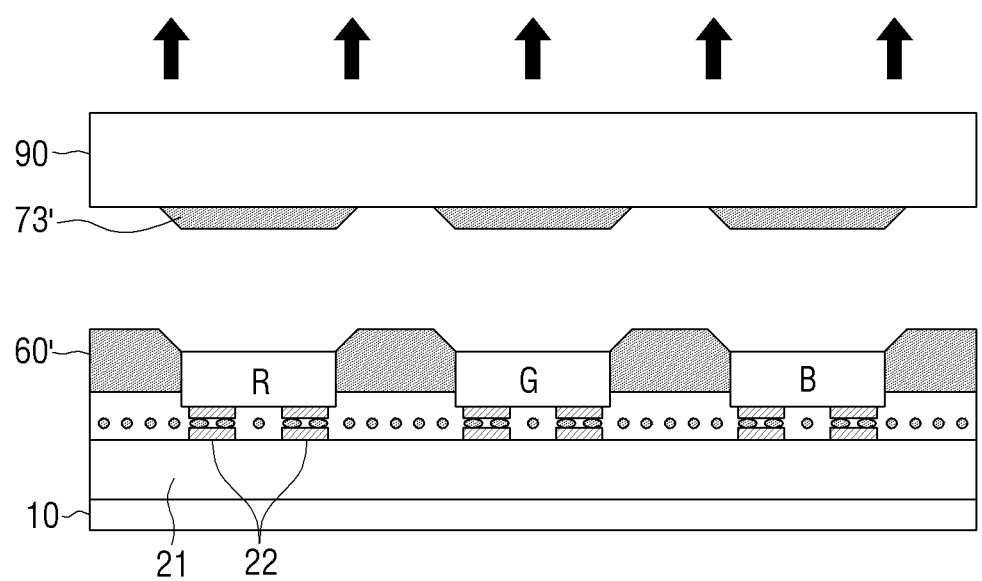
FIG. 13C is a cross-sectional diagram for illustrating a method of forming a black matrix layer according to an embodiment of the disclosure.

FIG. 13A to FIG. 13C are diagrams for illustrating a method of forming a black matrix layer according to an embodiment of the disclosure. Referring to FIG. 13A, when the black matrix layer 72' attached on the plurality of LEDs 50 (e.g. red LED 50R, green LED 50G, blue LED 50B) is removed at operation S650, a case wherein a part of the black matrix layer 72' remains on the plurality of LEDs 50 may occur.

In this case, as in FIG. 13B, a tape 90 may be attached on the black matrix layer 72', formed between and on the plurality of LEDs 50.

Afterwards, as in FIG. 13C, the black matrix layer 73' remaining on the plurality of LEDs 50 may be removed together with the tape 90.

Here, the adhesive force between the tape 90 and the black matrix layer 72' may be weaker than the adhesive force between the black matrix layer 72' and the adhesive layer 30. Accordingly, a portion of the black matrix layer 72' (e.g., black matrix layer 60') attached on the adhesive layer 30 may remain when the tape 90 is removed.

Also, the adhesive force between the plurality of LEDs 50 and the black matrix layer 72' attached on the plurality of LEDs 50 may be weaker than the adhesive force between the tape 90 and the black matrix layer 72'. Accordingly, when the tape 90 is removed, a portion of the black matrix layer 72' (the black matrix layer 73') attached on the plurality of LEDs 50 may be removed with the tape.

Meanwhile, in FIG. 13A to FIG. 13C, an embodiment wherein the adhesive layer 30 includes the anisotropic conductive film (ACF) 31 is illustrated, but this is merely an example, and it is also possible that an embodiment wherein the adhesive layer 30 includes the non-conductive film 35 is implemented.

According to an embodiment of the disclosure as above, the black matrix layer 60 is not formed on the plurality of LEDs 50, and by virtue of this, a defect that lights emitted from the plurality of LEDs 50 are covered by the black matrix layer 60 can be prevented.

Also, according to the various embodiments of the disclosure as above, in a display module and a manufacturing method thereof, a BM layer is formed without a tolerance in an area excluding LEDs, and thus expressiveness of the black color can be maximized, and the contrast ratio of the display can be improved.

Further, in a display module and a manufacturing method thereof according to an embodiment of the disclosure, LEDs and electrode pads of driving circuits are integrally connected together with formation of BMs in a large area, and thus there is an effect of simplifying processes and reducing the cost.

The display module according to the disclosure may be applied by being installed in wearable devices, portable devices, handheld devices, and electronic products or electronic components which require various types of displays in single units. Also, the display module may be applied to display devices such as monitors for personal computers (PCs), mobile phones, high resolution TVs and signage, electronic boards, etc. through assembly arrangement in plural units (a matrix type, etc.).

The various embodiments of the disclosure may be implemented as software including instructions stored in machine-readable storage media, which can be read by machines (e.g.: computers). The machines refer to devices that call instructions stored in a storage medium, and can operate according to the called instructions, and the devices may include an electronic device according to the aforementioned embodiments. In case an instruction is executed by a processor, the processor may perform a function corresponding to the instruction by itself, or by using other components under its control. An instruction may include a code that is generated or executed by a compiler or an interpreter. A storage medium that is readable by machines may be provided in the form of a non-transitory storage medium. Here, the term 'non-transitory' only means that a storage medium does not include signals, and is tangible, but does not indicate whether data is stored in the storage medium semi-permanently or temporarily.

Also, methods according to the various embodiments of the disclosure may be provided while being included in a computer program product. A computer program product refers to a product, and it can be traded between a seller and a buyer. A computer program product can be distributed on-line in the form of a storage medium that is readable by machines (e.g.: a compact disc read only memory (CD-ROM)), or through an application store (e.g.: play store TM). In the case of on-line distribution, at least a portion of a computer program product may be stored in a storage medium such as the server of the manufacturer, the server of the application store, and the memory of the relay server at least temporarily, or may be generated temporarily.

Further, each of the components according to the various embodiments of the disclosure (e.g.: a module or a program) may comprise or consist of a singular object or a plurality of objects. Also, among the aforementioned sub components, some sub components may be omitted, or other sub components may be further included in the various embodiments. Generally or additionally, some components (e.g.: a module or a program) may be integrated as an object, and perform the functions that were performed by each of the components before integration identically or in a similar manner. Operations performed by a module, a program, or other components according to the various embodiments may be executed sequentially, in parallel, repetitively, or heuristically. Or, at least some of the operations may be executed in a different order or omitted, or other operations may be added.

What is claimed is:

1. A display module comprising:
   a substrate;
   a driving circuit layer formed on the substrate, the driving circuit layer comprising a plurality of driving circuits and a plurality of electrode pads electronically connected with the plurality of driving circuits;
   an adhesive layer formed on the driving circuit layer;
   a plurality of light emitting diodes (LEDs), each of the plurality of LEDs formed on a respective area of the adhesive layer corresponding to a respective one of the plurality of electrode pads; and
   a black matrix layer formed on the adhesive layer, between the plurality of LEDs, wherein the display module is configured to include a plurality of pixels that comprise a plurality of sub pixels, and each of the plurality of electrode pads comprises a first area for bonding a first LED corresponding to a sub pixel among the plurality of sub pixels and a second area for bonding a second LED corresponding to the sub pixel based on the first LED being defective.

2. The display module of claim 1, wherein the black matrix layer is formed on the adhesive layer, between the plurality of LEDs, by:

attaching a black matrix formation layer, attached to a film, onto a portion of the adhesive layer, formed between the plurality of LEDs, and onto the plurality of LEDs through a thermo-compression process, and removing a first portion of black matrix formation layer, attached on the plurality of LEDs, together with the film from the plurality of LEDs such that a second portion of the black matrix formation layer remains between the plurality of LEDs as the black matrix layer.

3. The display module of claim 2, wherein the plurality of LEDs are electronically connected to the plurality of electrode pads through the thermo-compression process.

4. The display module of claim 3, wherein the adhesive layer comprises an anisotropic conductive film (ACF) comprising a conductive material, and the plurality of LEDs are electronically connected to the plurality of electrode pads through the conductive material by the thermo-compression process.

5. The display module of claim 3, wherein the adhesive layer comprises a non-conductive film comprising a flux, bumps are applied on an electrode of each of the plurality of LEDs or applied on the plurality of electrode pads, the bumps melted through the thermo-compression process, the plurality of LEDs are electronically connected to the plurality of electrode pads through the bumps, while the bumps are in a molten form, and the flux is configured to remove an oxide film generated when the bumps are melted.

6. The display module of claim 2, wherein an adhesive force between the adhesive layer and the black matrix formation layer is stronger than an adhesive force between the film and the black matrix formation layer.

7. The display module of claim 1, wherein the second LED is configured to emit a light of a same color as the first LED.

8. The display module of claim 1, wherein a size of each of the plurality of electrode pads is bigger than the size of the first LED, and the first area and the second area are electronically connected.

9. The display module of claim 1, wherein each of the plurality of LEDs is a micro LED of a flip-chip structure wherein an electrode is formed in a lower part of the flip-chip structure.

* * * * *